(12) United States Patent
Matsumoto et al.

(10) Patent No.: US 7,843,773 B2
(45) Date of Patent: Nov. 30, 2010

(54) CONTENTS PLAYBACK APPARATUS, CONTROL METHOD, AND ELECTRONIC DEVICE

(75) Inventors: Ryota Matsumoto, Tokyo (JP); Yuzo Ozaki, Kanagawa (JP); Michiko Okano, Tokyo (JP)

(73) Assignee: Sony Corporation, Tokyo (JP)

( * ) Notice: Subject to any disclaimer, the term of this patent is extended or adjusted under 35 U.S.C. 154(b) by 664 days.

(21) Appl. No.: 11/881,061

(22) Filed: Jul. 24, 2007

(65) Prior Publication Data
US 2008/0175121 A1    Jul. 24, 2008

(30) Foreign Application Priority Data
Jul. 31, 2006    (JP)    ............... 2006-207665

(51) Int. Cl.
*G11B 21/00*    (2006.01)
(52) U.S. Cl. .................................. 369/29.02
(58) Field of Classification Search ............. 369/29.02, 369/47.1, 43, 53.38, 53.52, 53.4, 53.43; 361/139, 361/142, 724, 752, 755; 700/94; 720/660, 720/600
See application file for complete search history.

(56) References Cited
U.S. PATENT DOCUMENTS
2005/0079897 A1*   4/2005  Nishijima et al. ........ 455/575.1
2006/0114221 A1    6/2006  Sakurai et al.
2007/0100935 A1*   5/2007  Miyazaki et al. ............ 709/203
2008/0154404 A1*   6/2008  Kedem et al. .................. 700/94

FOREIGN PATENT DOCUMENTS

| EP | 1193643 A1 | 4/2002 |
|---|---|---|
| JP | 03-021995 A | 1/1991 |
| JP | 04-006100 | 1/1992 |
| JP | 2001-042897 A | 2/2001 |
| JP | 2001-142474 A | 5/2001 |
| JP | 2002-093142 A | 3/2002 |
| JP | 2003-076396 A | 3/2003 |
| JP | 2003-084902 | 3/2003 |
| JP | 2004-240337 A | 8/2004 |
| JP | 2004-296129 A | 10/2004 |
| WO | WO 00/70438 A1 | 11/2000 |

* cited by examiner

*Primary Examiner*—Thang V Tran
(74) *Attorney, Agent, or Firm*—Wolf, Greenfield & Sacks, P.C.

(57) ABSTRACT

A contents playback apparatus includes a tubular casing, a contents playback unit disposed in the casing, an operation element rotatably disposed around the casing and axially movably disposed on the casing, a magnet disposed on the operation element, a plurality of Hall devices disposed in the casing for detecting a density of magnetic fluxes from the magnet in a contactless fashion, and a controller for determining a position of the operation element based on the density of magnetic fluxes detected by the Hall devices upon movement of the operation element, and controlling the contents playback unit to play back contents depending on the determined position of the operation element.

10 Claims, 17 Drawing Sheets

FIG.17A
FIG.17B
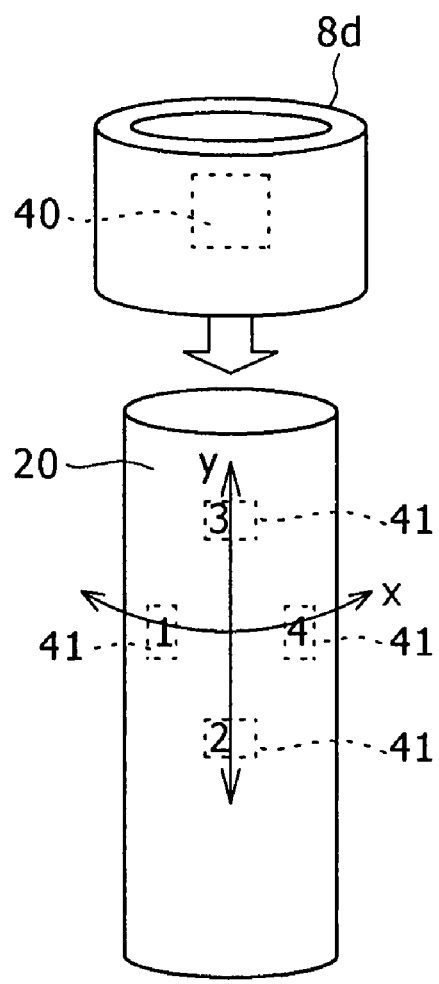
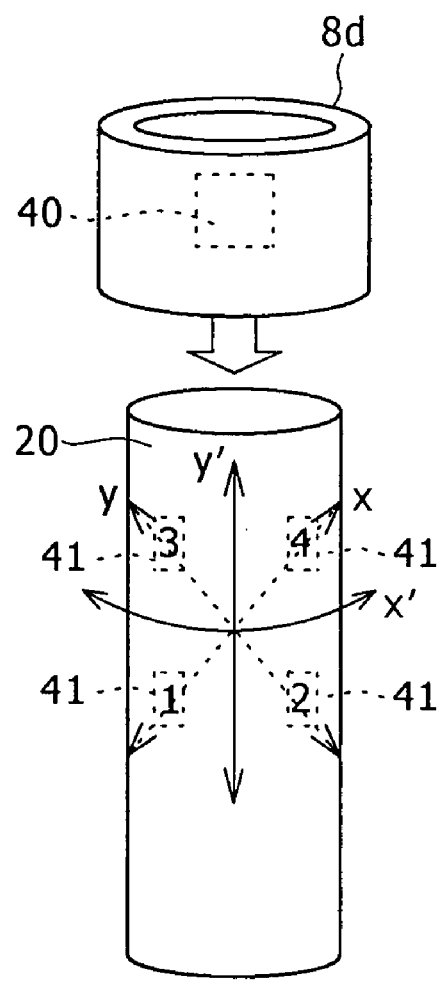

X-DIRECTION ROTATIONAL ANGLE (°)

CONTENTS PLAYBACK APPARATUS, CONTROL METHOD, AND ELECTRONIC DEVICE

CROSS REFERENCES TO RELATED APPLICATIONS

The present invention contains subject matter related to Japanese Patent Application JP 2006-207665 filed in the Japan Patent Office on Jul. 31, 2006, the entire contents of which being incorporated herein by reference.

BACKGROUND OF THE INVENTION

1. Field of the Invention

The present invention relates to a contents playback apparatus for playing back stored contents based on a desired function, a control method for such a contents playback apparatus, and an electronic device.

2. Description of the Related Art

In recent years, there have been developed small portable contents playback apparatus for storing contents such as music pieces, photographs, and moving images, in a semiconductor memory and playing back the stored contents according to instructions from the user. Particularly, as the storage capacity of semiconductor memories has increased and the cost thereof has decreased, contents playback apparatus that are very small in size and can store a large amount of contents have emerged and are finding a wider range of applications.

Since the contents playback apparatus can store a large amount of various contents, they incorporate various playback functions to be able to quickly find and play back favorable data of the user. For example, if a contents playback apparatus has read music data from a CD (Compact Disc) or the like and stored the read music data, then the user can select, from the functions of the contents playback apparatus, a function to retrieve desired music pieces sorted by artist or album and play back the retrieved music pieces, a function to narrow down desired music pieces in a certain range such as a play list set by the user and play back the chosen music pieces, or a shuffle playback function to play back music pieces in a sequence which differs each time they are played back.

Heretofore, a mechanism with a dial-type operation element for easily selecting and deciding on contents to be played back and a playback function in a contents playback apparatus has been disclosed in Japanese Patent Laid-open No. 2003-84902.

The mechanism with the dial-type operation element for selecting contents to be played back includes an electronic switch disposed in a casing. The operation of the operation element that is manipulated by the user is mechanically transmitted to the electronic switch. Therefore, a certain link mechanism needs to be provided between the operation member and the electronic switch. However, the link mechanism presents an obstacle to efforts to reduce the size of the casing and also to efforts to effectively utilize the space in the casing. Another problem is that as the link mechanism is provided between the operation member and the electronic switch in the casing, the casing needs to have a hole defined in a wall thereof for passage of the link mechanism therethrough, and hence cannot be made sufficiently water-resistant.

SUMMARY OF THE INVENTION

According to the present invention, there is provided a contents playback apparatus including a tubular casing, a contents playback unit disposed in the casing, an operation element rotatably disposed around the casing and axially movably disposed on the casing, a magnet disposed on the operation element, a plurality of Hall devices disposed in the casing for detecting a density of magnetic fluxes from the magnet in a contactless fashion, and a controller for determining a position of the operation element based on the density of magnetic fluxes detected by the Hall devices upon movement of the operation element, and controlling the contents playback unit to play back contents depending on the determined position of the operation element.

In the contents playback apparatus, the operation element is rotatably disposed around and axially movably disposed on the casing, and movement of the operation element is detected in a contactless fashion by the magnet and the Hall devices. Therefore, no link mechanism is required for transmitting the movement of the operation element to an element in the casing. The casing thus requires no hole for passing a link mechanism therethrough, and is hence kept water-resistant. As the rotation and axial movement of the operation element is detected by the Hall devices, many positions of the operation element can be detected for allowing the contents playback apparatus to play back contents according to a wide variety of functions.

According to the present invention, there is also provided a control method of detecting the position of an operation element rotatably disposed around a tubular casing and axially movably disposed on the tubular casing, and controlling a contents playback unit disposed in the casing to play back contents depending on the detected position of the operation element, including the steps of detecting a density of magnetic fluxes from a magnet disposed in the casing with a plurality of Hall devices disposed in the casing upon movement of the operation element, determining the position of the operation element based on the detected density of magnetic fluxes, and controlling the contents playback unit to play back contents depending on the determined position of the operation element.

In the above control method, the position of the operation element that is rotatably disposed around and axially movably disposed on the casing is detected in a contactless fashion by the magnet and the Hall devices. Therefore, the position of the operation element can be detected accurately in a contactless fashion without the need for a link mechanism.

According to the present invention, there is further provided an electronic device including a tubular casing, an electronic circuit disposed in the casing, an operation element rotatably disposed around the casing and axially movably disposed on the casing, a magnet disposed on the operation element, a plurality of Hall devices disposed in the casing for detecting a density of magnetic fluxes from the magnet in a contactless fashion, and a controller for determining a position of the operation element based on the density of magnetic fluxes detected by the Hall devices upon movement of the operation element, and controlling the electronic circuit depending on the determined position of the operation element.

In the electronic device, the operation element is rotatably disposed around and axially movably disposed on the casing, and movement of the operation element is detected in a contactless fashion by the magnet and the Hall devices. Therefore, no link mechanism is required for transmitting the movement of the operation element to an element in the casing. The casing thus requires no hole for passing a link mechanism therethrough, and is hence kept water-resistant. As the rotation and axial movement of the operation element is detected by the Hall devices, many positions of the operation element can be detected for allowing the electronic device to be controlled according to a wide variety of functions.

The Hall devices may include four Hall devices disposed in respective positions displaced off an axis along which the operation element is rotatable around the casing and an axis along which the operation element is movable axially along the casing. With this arrangement, the sensitivity difference between the Hall devices depending on the position of the operation element is reduced for more accurate positional detection.

The contents playback apparatus may further include a yoke member mounted on a side of the magnet remote from the casing. With this arrangement, magnetic fluxes from the magnet toward the yoke member are reduced, and the density of magnetic fluxes from the magnet toward the Hall devices is increased.

According to the present invention, since the operation element mounted on the tubular casing is positionally detected in a contactless fashion, the number of holes defined in the casing for terminals to be connected to external devices and a display panel to be placed in the casing is minimized. A water blocking member can easily be placed between the holes and a cover placed in covering relation to the holds.

As the position of the operation element is detected in a contactless fashion, no link mechanism is required to transmit movement of the operation element to an element in the casing. Thus, the space in the casing can effectively be utilized, and the casing can be reduced in size. The ability of the casing to prevent water from entering the casing is increased, making the casing highly water-resistant.

The above and other features and advantages of the present invention will become apparent from the following description when taken in conjunction with the accompanying drawings which illustrate a preferred embodiment of the present invention by way of example.

BRIEF DESCRIPTION OF THE DRAWINGS

FIGS. 17A and 17B are perspective views showing the layouts of four Hall devices;

DETAILED DESCRIPTION OF THE PREFERRED EMBODIMENT

Figure 1:
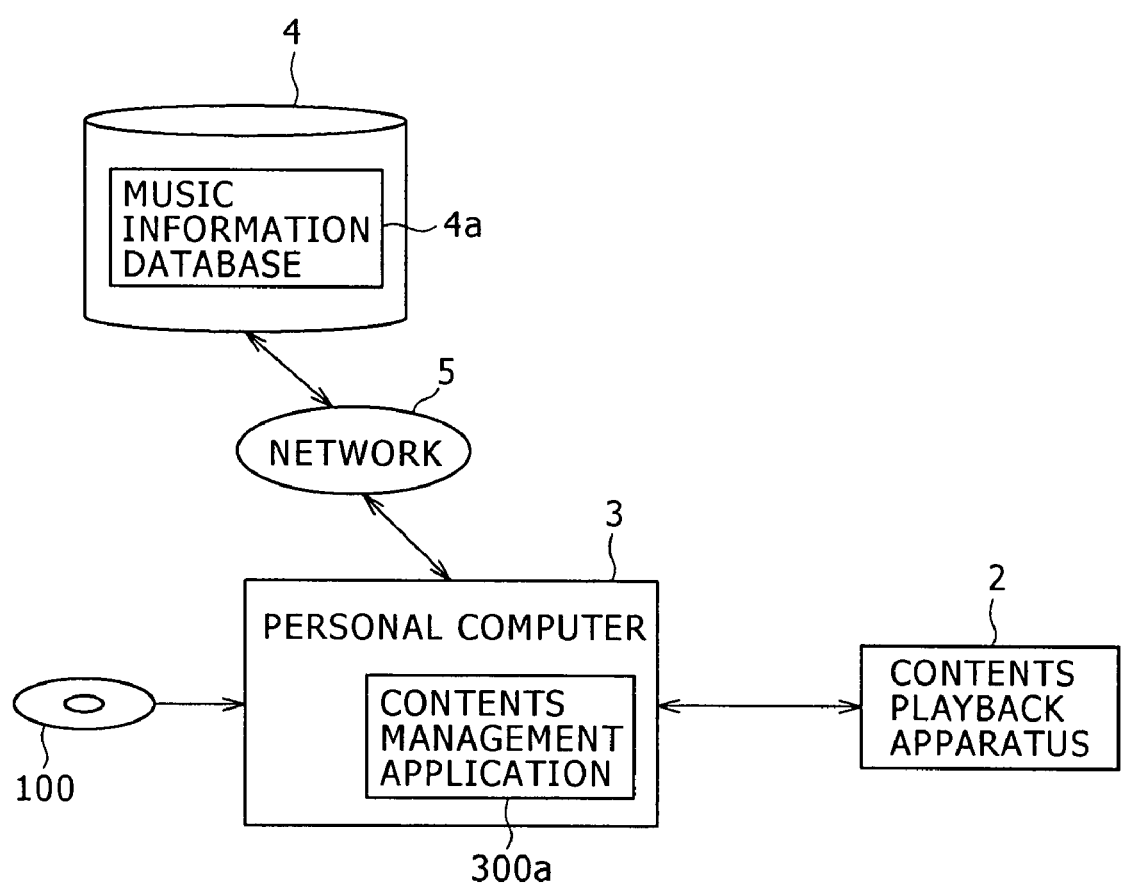
FIG. 1 is a block diagram of a recording and reproducing system incorporating a contents playback apparatus according to an embodiment of the present invention.

FIG. 1 shows in block form a recording and reproducing system 1 incorporating a contents playback apparatus according to an embodiment of the present invention. As shown in FIG. 1, the recording and reproducing system 1 includes at least a contents playback apparatus 2, a personal computer 3, a server 4, a network 5, and an optical disc 100.

The contents playback apparatus 2 is of a portable structure and includes a recording medium such as a semiconductor memory, e.g., a flash memory. The personal computer 3, which serves as an information processor, is capable of data communications with the contents playback apparatus 2 through a USB (Universal Serial Bus) cable or the like. The personal computer 3 can also perform data communications with an external apparatus (the server 4) through the network 5.

It is assumed that the recording and reproducing system 1 operates in a mode wherein the personal computer 3 reads contents from the optical disc 100 and downloads the read contents into the contents playback apparatus 2, which plays back the downloaded contents.

It is also assumed that the optical disc 1 is a music CD (Compact Disc) that is commercially available as a package medium, and contents stored in the optical disc 1 are audio data. Though contents stored in the optical disc 1 may alternatively be image data, moving image data, and data in various other formats usable in other application software, the contents will be described as audio data for illustrative purpose in the present embodiment.

The personal computer 3 has application software, i.e., a contents management application 300a, installed therein for allowing the recording and reproducing system 1 to operate in the above mode.

The contents management application 300a is an application for reading contents from the optical disc 100, editing the read contents, and downloading the contents into the contents playback apparatus 2.

For example, the user activates the contents, management application 300a and operates personal computer 3 according to instructions thereof to read contents from the optical disc 100, and edit the read contents to classify them by album, generate a play list, and delete some contents, for example.

The contents management application 300a has a function to download contents stored in the personal computer 3 into the contents playback apparatus 2 depending on the operation by the user of the personal computer 3 when the contents playback apparatus 2 is connected to the personal computer 3.

The contents management application 300a also has a function to compress contents from the optical disc 100 according to a certain compression encoding process such as ATRAC (Adaptive TRansform Acoustic Coding) or MP3 (MPEG Audio Layer 3) and record the compressed contents for thereby allowing the contents playback apparatus 2 to record many contents.

The contents management application 300a may also be able to acquire additional information of the contents read from the optical disc 100, such as music titles (track titles), related album titles, artist names, etc.

It has heretofore been customary to acquire additional information about music pieces recorded in the optical disc 100 based on the information extracted from the optical disc 100. For example, the TOC (Table Of Contents) data of a CD stores therein the number of tracks (number of music pieces) recorded in the CD, the addresses (absolute time information) of the respective tracks, and the total performance time. The CDs having the same title have the same TOC data. It is impossible for CDs having different titles to have identical TOC data. Therefore, a code inherent in a CD can be generated from the TOC data thereof. A music information database is constructed which stores additional information about tracks of each of CD titles corresponding to respective inherent codes. Based on the inherent code of a CD to be played back, the additional information about the music pieces recorded in the CD can be acquired from the music information database.

It is assumed that the music information database, referred to as a music information database 4a, is constructed in the server 4 that is connected to the network 5.

In response to an instruction from the user to read contents from the loaded optical disc 100, the contents management application 300a generates an inherent code based on the TOC data of the optical disc 100. The contents management application 300a then accesses the server 4 and refers to the music information database 4a using the inherent code as a retrieval condition to acquire additional information corresponding to the contents recorded in the optical disc 100.

Then, the contents management application 300a generates management information for managing the contents read from the optical disc 100 and the acquired additional information in association with each other, and manages the contents based on the generated management information.

The technology for acquiring the additional information corresponding to the contents recorded in the optical disc 100 from the music information database 4a is of known nature, and will not specifically be described below.

In the illustrated embodiment, the music information database 4a is constructed in the server 4 that is connected to the personal computer 3 through the network 5. However, the recording and reproducing system 1 may be arranged such that the personal computer 3 incorporates the music information database 4a wholly or in part.

As described above, the contents stored in the personal computer 3 and associated with the additional information are downloaded into the contents playback apparatus 2, and recorded in the recording medium included in the contents playback apparatus 2. The contents playback apparatus 2 is now capable of playing back the contents recorded in the recording medium, and also displaying the additional information, e.g., track titles, album titles, artist names, etc. about the contents.

Figure 2:
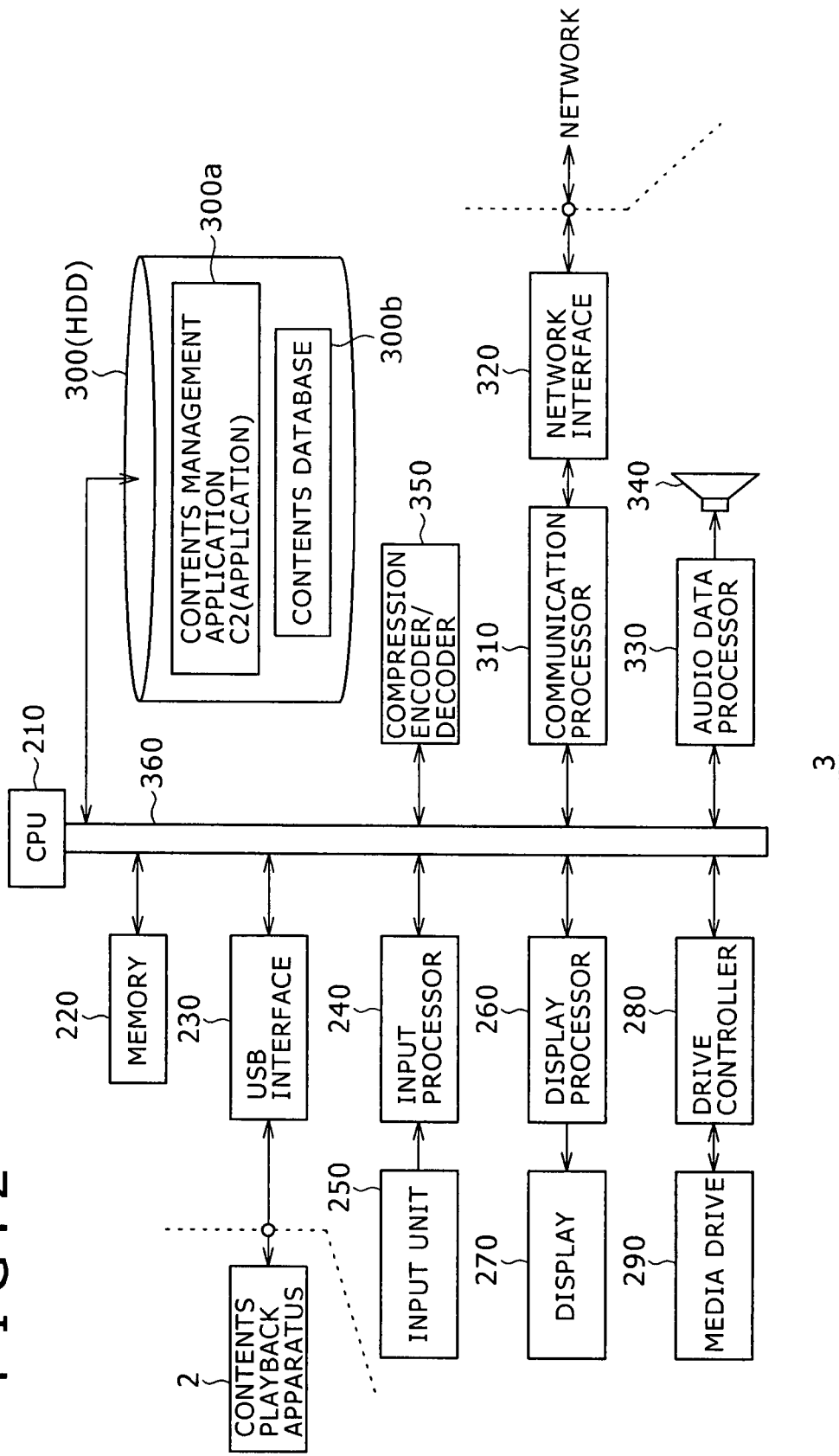
FIG. 2 is a block diagram of internal details of a personal computer of the recording and reproducing system.

FIG. 2 shows in block diagram internal details of the personal computer 3 shown in FIG. 1. In FIG. 2, a CPU 210 controls the personal computer 3 in its entirety and performs various processing operations based on a program that has been activated. For example, the CPU 210 accepts inputs from the user, sends outputs for the user, stores data files in a HDD (Hard Disk Drive) 300, generates and updates management information, etc. The CPU 210 exchanges control signals and data with various parts of the personal computer 3 through a bus 360.

A memory 220 collectively represents a ROM, a RAM, and a flash memory that are used by the CPU 210 for processing processes. The ROM stores operating programs for the CPU 210, a program loader, etc. The flash memory stores various processing operation coefficients, parameters for use in programs, etc. The RAM temporarily provides data areas and task areas that are necessary for executing programs.

A USB interface 230 is used to perform data communications with a connected external apparatus through a USB cable. In particular, the USB interface 230 sends various data such as audio data, etc. to and receives those data from the contents playback apparatus 2 shown in FIG. 3.

The HDD 300 stores data files, generates and updates management information, etc. under the control of the CPU 210. For example, the HDD 300 stores contents read from the optical disc 100. The contents stored in the HDD 300 are associated with additional information acquired from the music information database 4a and are managed. Contents management information for managing the contents is also recorded in the HDD 300. The contents recorded in the HDD 300 and the contents management information are referred to as a contents database 300b.

The HDD 300 also stores a program (application) that is run by the personal computer 3 to perform its various functions. According to the present embodiment, the contents management application 300a described above with reference to FIG. 1 for managing the contents is stored in the HDD 300.

An input unit 250 includes a keyboard, a mouse, a remote commander, or any of various input devices, not shown, combined with the personal computer 3. The input unit 250 is operated by the user to enter various operation inputs and input data. The information entered from the input unit 250 is processed by an input processor 240, and transmitted as operation or data inputs to the CPU 210. The CPU 210 performs various processing operations and control processes based on the input information.

A media drive 290 includes a drive function unit compatible with various recording mediums including an optical disc such as a CD, an MD (Mini Disc: magnetooptical disc), a CD-R (Recordable), a CD-RW (ReWritable), a DVD (Digital Versatile Disc), a DVD-R, a DVD-RW, or the like, or a memory card, i.e., a semiconductor memory as a removable medium. The media drive 290 is capable of recording data in and reproducing data from those recording mediums. If the media drive 290 is compatible with a CD medium such as the optical disc 100 according to the present embodiment, then the media drive 290 includes an optical head, a spindle motor, a reproduced signal processor, a servo circuit, etc.

A drive controller 280 controls the media drive 290 to record data in and reproduced data from the medium loaded in the media drive 290, and also to access the medium loaded in the media drive 290. For example, if the user operates the input unit 250 to play back the medium loaded in the media drive 290, then the CPU 210 instructs the drive controller 280 to play back the medium. The drive controller 280 then controls the media drive 290 to access the medium and play back the medium. The media drive 290 sends the data read from the medium to the bus 360 through the drive controller 280.

An audio data processor 330 processes audio data supplied thereto for sound field processing such as equalization, volume adjustment, D/A conversion, amplification, etc. under the control of the CPU 210, and outputs the processed audio data through a speaker 340. For example, if audio data read by the media drive 290 or audio data (contents) stored in the HDD 300 are to be reproduced, then the audio data are processed by the audio data processor 330 and then output through the speaker 340.

Some contents stored in the contents database 300b in the HDD 300 may have been compressed by a certain compression encoding process. Those compressed contents are decoded by a compression encoder/decoder 350, to be described later, into normal audio data, which are then supplied to the audio data processor 330.

A display 270 includes a display device such as a liquid crystal display panel or the like, and displays various items of information for the user. For example, if the CPU 210 supplies a display processor 260 with display data depending on various operation states, input states, and communication states, then the display processor 260 energizes the display 270 based on the supplied display data to display necessary information.

If video data are reproduced from the medium loaded in the media drive 290 or the HDD 300, then the display processor 260 processes the reproduced video data into a video signal and energizes the display 270 to display an image based on the video signal.

A communication processor 310 encodes transmission data and decodes reception data under the control of the CPU 210. A network interface 320 transmits the encoded transmission data through the network 5 shown in FIG. 1 to another device, e.g., the server 4. The network interface 320 also receives data transmitted from another device, e.g., the server 4, through the network 5, and delivers the received data to the communication processor 310. The communication processor 310 transfers the received information to the CPU 210.

The compression encoder/decoder 350 compresses audio data according to a certain compression encoding process, and decodes, i.e., expands, data compressed according to a certain compression encoding process. Although the compression encoder/decoder 350 is shown as a hardware component, it may be software-implemented by the CPU 210.

The personal computer 3 is not limited to the internal details shown in FIG. 2, but may be of any of various structures. For example, the personal computer 3 may have terminals for connection to a microphone and external headphones, a video input/output terminals for recording and reproducing DVDs, a line connection terminal, and an SPDIF terminal.

Figure 3:
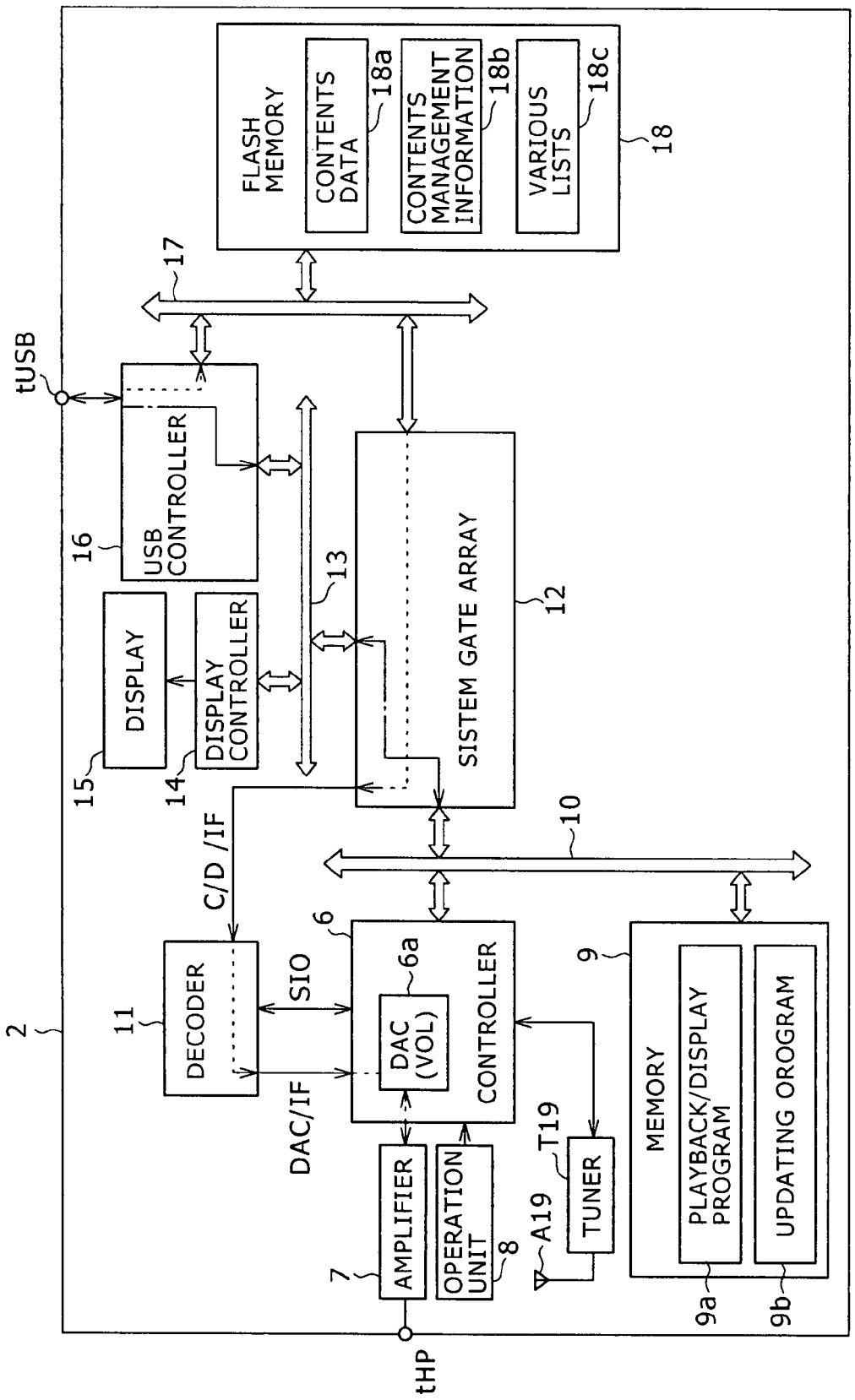
FIG. 3 is a block diagram of internal details of the contents playback apparatus.

FIG. 3 shows in block form internal details of the contents playback apparatus 2. The contents playback apparatus 2 includes a flash memory 18 as a recording medium for storing contents downloaded from the personal computer 3. The flash memory 18 may have a storage capacity in the range from several hundreds MB (MegaByte) to several GB (GigaByte).

The contents playback apparatus 2 has, in addition to a function to play back contents stored in the flash memory 18, a tuner T19 and an antenna A19 for receiving and selecting FM (Frequency Modulation) broadcasts. The tuner T19 and the antenna A19 are not indispensable components, and may be included if necessary.

As shown in FIG. 3, a controller 6 includes a D/A conversion function provided as a DAC (D/A converter) 6a and a sound level adjusting function.

To the controller 6, there are connected an amplifier 7, an operation unit 8, and the tuner T19. The amplifier 7 is supplied with audio data converted by the DAC 6a and adjusted in level by the sound level adjusting function, amplifies the supplied audio data, and supplies the amplified audio data to a headphone terminal tHP.

The operation unit 8 has various operation elements exposed on an outer surface of a casing of the contents playback apparatus 2. When the controller 6 is supplied with operation signals corresponding to the operation elements of the operation unit 8, the controller 6 controls various components of the contents playback apparatus 2 to perform operation modes depending on the operation signals. Therefore, the user can operate the contents playback apparatus 2 to perform those operation modes by operating the operation elements of the operation unit 8.

The tuner T19 receives and selects an FM broadcast signal supplied from the antenna A19, and supplies a produced audio signal to the controller 6. The controller 6 adjusts the sound level of the audio signal supplied from the tuner T19, and supplies the adjusted audio signal to the amplifier 7.

A memory 9 is connected to the controller 6 through a first bus 10. The memory 9 includes a nonvolatile memory such as a flash memory. The memory 9 stores coefficients for use in various processing operations performed by the controller 6 and parameters for use in programs run by the controller 6.

Particularly in the present embodiment, the memory 9 stores a playback/display program 9a to be executed by the controller 6 and an updating program 9b to be executed by the controller 6.

The playback/display program 9a and the updating program 9b may be stored in the flash memory 18 or a ROM in the controller 6.

A decoder 11 is connected to the controller 6 through an DAC I/F and an SIO. The decoder 11 serves to decode audio data that have been compressed by the compression encoding process. The decoder 11 also serves to perform an audio signal processing process such as a surrounding sound generating process on the audio data decoded by the decoder 11.

The audio data output from the decoder 11 are supplied through the DAC I/F to the controller 6. In the controller 6, the audio data are converted by the DAC 6a and adjusted in sound level, and then supplied to the amplifier 7. The amplifier 7 amplifies the audio data and supplies the amplified audio data to the headphone terminals tHP. The controller 6 sends various control instructions to the decoder 11 through the SIO.

A system gate array 12 is connected to the controller 6 through a first bus 10. The system gate array 12 includes an LSI (Large Scale Integration) circuit for controlling the transfer of various data such as audio data and commands to various components of the contents playback apparatus 2.

The system gate array 12 is also connected to the decoder 11 through a C/D I/F, to a display controller 14 and a USB controller 16 through a second bus 13, and to the flash memory 18 through a third bus 17.

A display 15 includes a display device such as an organic EL (ElectroLuminescence) display, a liquid crystal display, or the like, and serves to display various items of information for the user.

The display controller 14 energizes the display 15 to display various items of information based on display data supplied from the controller 6 through the first bus 10, the system gate array 12, and the second bus 13.

The USB controller 16 performs data communications with an external device (the personal computer 3) through a USB cable connected to a USB terminal tUSB. Specifically, the USB controller 16 performs data communications by encoding transmission data and decoding reception data according to the USB communication process.

According to the present embodiment, it is assumed that the contents playback apparatus 2 is compatible with the USB mass storage class (MSC). When the contents playback apparatus 2 is connected to the personal computer 3 by the USB cable, the contents playback apparatus 2 is recognized as an external storage device by the personal computer 3.

Contents transferred from the personal computer 3 are supplied through the USB controller 16 to the contents playback apparatus 2.

When contents are received from the personal computer 3, the USB controller 16 transfers the received contents through the third bus 17 directly to the flash memory 18, which writes the supplied contents therein. In other words, the contents transferred from the personal computer 3 are recorded in the flash memory 18 under the control of the USB controller 16.

In addition, various information including contents management information and various lists (lists of music pieces sorted by playback count, a list of artist links, lists of music pieces sorted by released year, and a play list) that are transferred from the personal computer 3 is also transferred through the third bus 17 directly to the flash memory 18 and recorded in the flash memory 18 under the control of the USB controller 16.

In FIG. 3, the contents, the content management information, and the information of the lists that are stored in the flash memory 18 are referred to as contents data 18a, contents management information 18b, and various lists 18c.

When contents are downloaded from the personal computer 3 into the contents playback apparatus 2, commands are also transferred from the personal computer 3 to the contents playback apparatus 2. Specifically, the commands from the personal computer 3 are transferred from the second bus 13 to the system gate array 12 to the first bus 10 to the controller 6 under the control of the USB controller 16, so that the commands can be interpreted by the controller 6. The controller 6 performs required processing operations depending on the commands.

When the contents data 18a stored in the flash memory 18 are played back, the contents (compressed audio data) read from the flash memory 18 are supplied through the third bus 17 to the system gate array 12 based on an instruction from the controller 6.

The system gate array 12 supplies the compressed audio data through the C/D I/F to the decoder 11. The decoder 11 decodes the compressed audio data, performs an audio signal processing process on the decoded audio data, and supplies the processed audio data through the DAC I/F to the controller 6.

The controller 6 converts the audio data with the DAC 6a, adjusts the audio data in sound level, and then supplies the audio data to the amplifier 7. The amplifier 7 amplifies the audio data and supplies the amplified audio data to the headphone terminals tHP.

Figure 4:
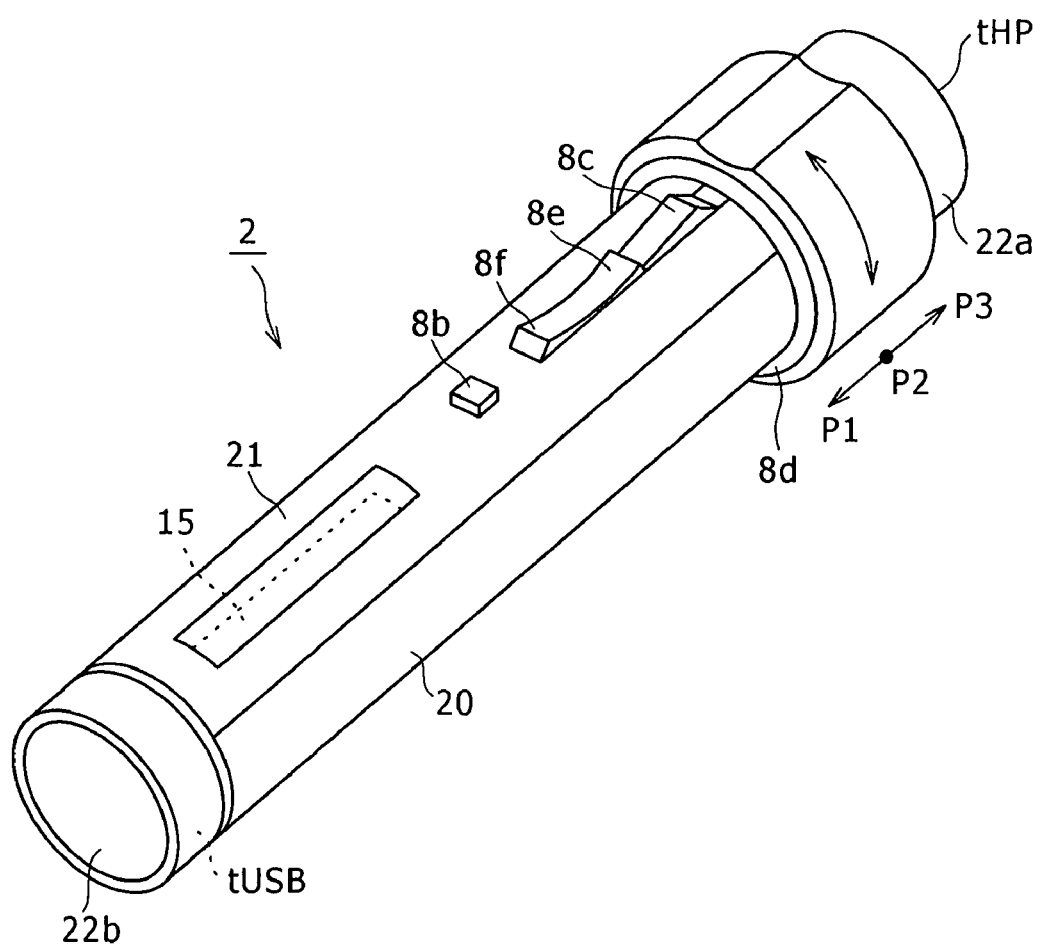
FIG. 4 is a perspective view of the contents playback apparatus.

FIG. 4 shows in perspective the contents playback apparatus 2, illustrating main operation elements of the operation unit 8 shown in FIG. 3. The contents playback apparatus 2 includes a casing 20 in the form of a tubular body made of metal such as aluminum or the like. The headphone terminal tHP is mounted on an end of the casing 20 and the USB terminal tUSB is mounted on the other end thereof.

The USB terminal tUSB is covered with a second cap 22b and the headphone terminal tHP is covered with a first cap 22a. The first cap 22a has an opening through which a headphone jack can be inserted.

The casing 20 includes a flat surface on its upper portion with a hole defined therein for placing the display 15 therein and a hole defined therein for placing button switches of the operation unit 8 therein. The flat surface of the casing 20 is covered with a casing cover 21 of a partly cylindrical shape. The casing cover 21 is made of light-permeable plastics. The casing cover 21 mounted on the casing 20 provides a smooth round surface entirely around the casing 20, making the casing 20 cylindrical in overall shape.

The operation unit 8 includes a DISP/MENU key 8b, a PLAY/STOP key 8c, a shuttle switch 8d, a VOL+ key 8e, and a VOL− key 8f. The DISP/MENU key 8b is an operation element for changing display information on the display 15 and displaying a MENU screen for making various settings. The PLAY/STOP key 8c is an operation element for starting and stopping playing back contents and deciding on various selection items.

The shuttle switch 8d is an operation element that can slide to three positions P1, P2, P3 along the axis of the casing 20 and can turn in two circumferential directions of the casing 20 as indicated by the arrows.

When the shuttle switch 8d is turned in one direction, it activates an FF mode to fast feed and skip tracks and forwardly feed selection items. When the shuttle switch 8d is turned in the other direction, it activates an FR mode to rewind and access tracks and reversely feed selection items.

When the shuttle switch 8d is slid to the position P1, it places the contents playback apparatus 2 in a HOLD mode. In the HOLD mode, the contents playback apparatus 2 does not accept any operation inputs.

The position P2 is a neutral position. When the FF mode is activated while the shuttle switch 8d is in the position P2, tracks are fast-fed during playback, and tracks are skipped during stop. When the FR mode is activated while the shuttle switch 8d is in the position P2, tracks are rewound during playback, and tracks are accessed during stop. The position P2 is also referred to as a track position.

The position P3 is an album position. When the shuttle switch 8d is slid to the album position during playback, albums or play lists are skipped one by one in the FF mode. Specifically, tracks are forwardly fed to the first track of an album that is determined to be played back next to the album to which the track being played back belongs. In the FR mode, albums or play lists are reversely fed one by one. Specifically, tracks are reversely fed to the first track of an album that is prior to the album to which the track being played back belongs, in the playback sequence.

The VOL+ key 8e and the VOL− key 8f are operation elements for adjusting the sound level. Specifically, the VOL+ key 8e is an operation element for increasing the sound level, and the VOL− key 8f is an operation element for reducing the sound level.

According to the present invention, the shuttle switch 8d that is slidable and angularly movable with respect to the casing 20 is positionally detected in a contactless manner in the casing 20 by a magnet and a plurality of Hall devices. The magnet is mounted on the surface of the shuttle switch 8d which faces the casing 20, and the Hall devices are disposed in the casing 20 for detecting the density of magnetic fluxes from the magnet. The manner in which the shuttle switch 8d is positionally detected by the magnet and the Hall devices will be described later.

Figure 5:
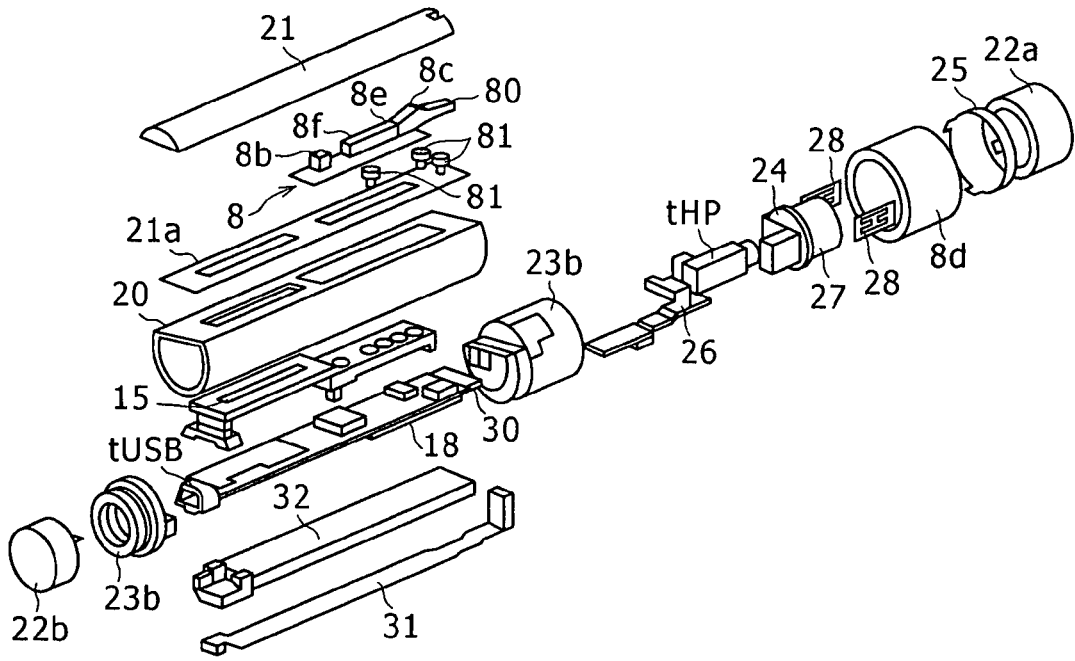
FIG. 5 is an exploded perspective view of the contents playback apparatus.
Figure 6:
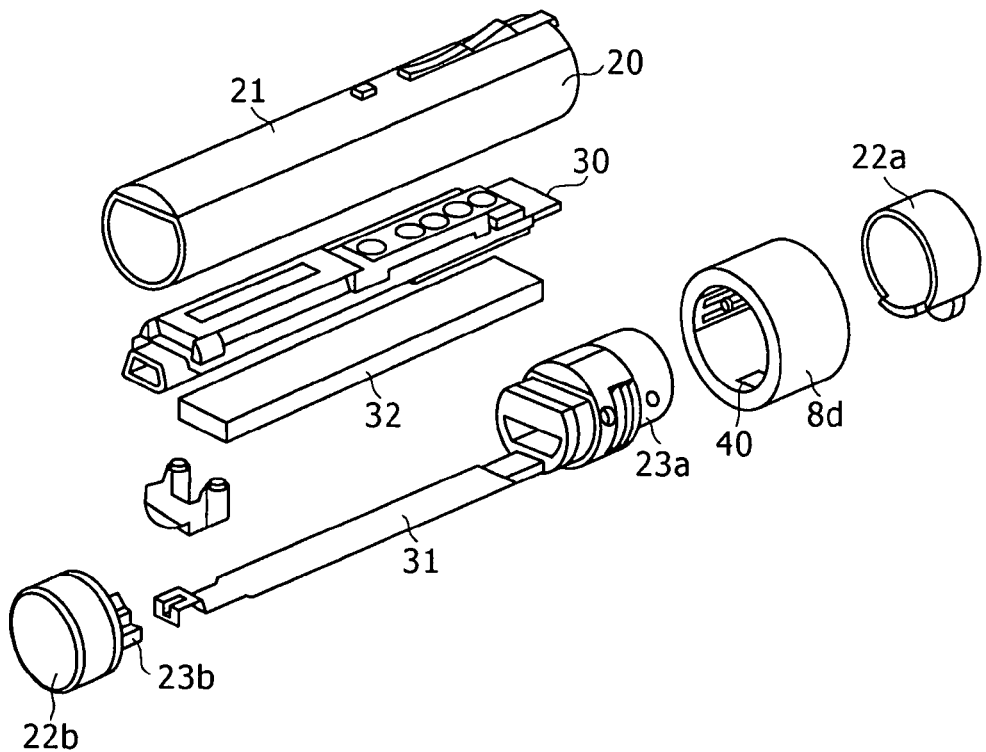
FIG. 6 is a partly exploded perspective view of the contents playback apparatus, as viewed from above.
Figure 7:
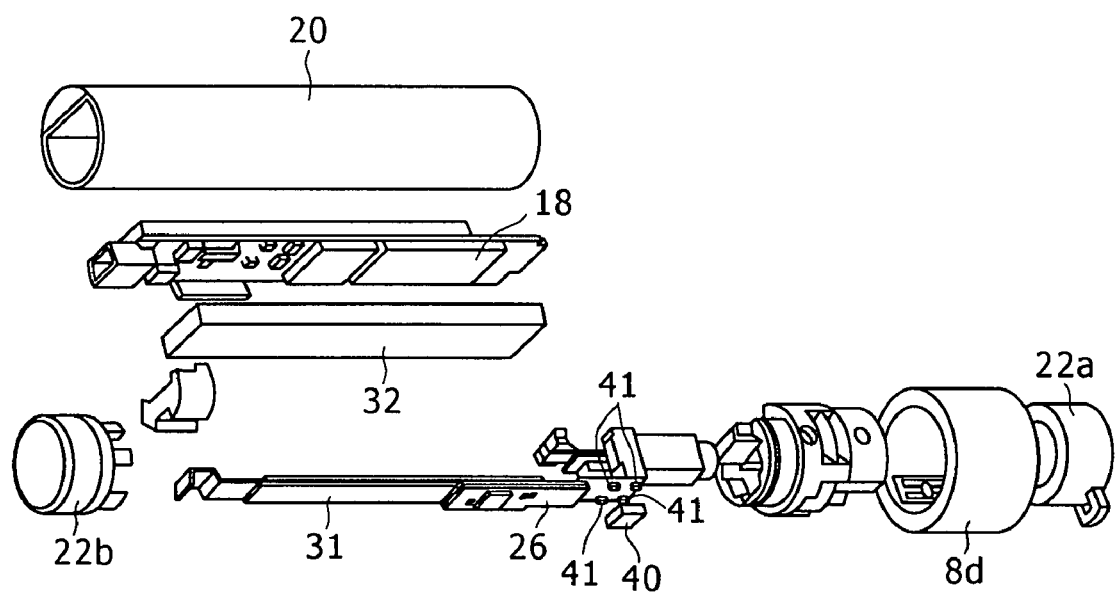
FIG. 7 is a partly exploded perspective view of the contents playback apparatus, as viewed from below.

FIG. 5 shows in exploded perspective the contents playback apparatus 2, FIG. 6 shows in partly exploded perspective the contents playback apparatus 2, as viewed from above, and FIG. 7 shows in partly exploded perspective the contents playback apparatus 2, as viewed from below.

As shown in FIGS. 5 through 7, the tubular casing 20 houses therein a board 30, a frame 31, a flat battery 32, a switch assembly 33, and the display 15. The flash memory 18 is mounted on the reverse surface of the board 30. ICs and circuits of the controller 6, the amplifier 7, the memory 9, the decoder 11, the system gate array 12, the display controller 14, and the USB controller 16 shown in FIG. 3 are also mounted on the reverse surface of the board 30.

The flat battery 32 which is mounted on the frame 31 is disposed on the reverse surface of the board 30. If the flat battery 32 is a storage cell, then it is supplied with charging electric power from the personal computer 3 through the USB terminal tUSB. The display 15 and the switch assembly 33 are disposed on the face surface of the board 30. The display 15 is connected to the display controller 14 that is mounted on the board 30.

With the board 30, the frame 31, the flat battery 32, the switch assembly 33, and the display 15 being housed in the casing 20, a first sleeve 23a is fitted in one of the axial openings of the casing 20 and a second sleeve 23b in the other axial opening of the casing 20.

The first sleeve 23a has an end portion shaped complementarily to the opening of the casing 20 and inserted in the casing 20. The other end portion of the first sleeve 23a extends out of the casing 20 and is cylindrical in shape. The board 30 has an end fitted in the end portion of the first sleeve 23a that is inserted in the casing 20, and hence is supported in the casing 20 by the first sleeve 23a.

The second sleeve 23b also has an end portion shaped complementarily to the opening of the casing 20 and inserted in the casing 20. The other end portion of the second sleeve 23b extends out of the casing 20 and is cylindrical in shape. The USB terminal tUSB is mounted on the other end of the board 30 is inserted in the end portion of the second sleeve 23b that is inserted in the casing 20, for connection to an external terminal. The second cap 22b, which is cylindrical in shape, is mounted on the other end portion of the second sleeve 23b, and serves as a lid when the USB terminal tUSB is not in use.

An inner sleeve 24 is inserted in the first sleeve 23a. Specifically, the inner sleeve 24, with the headphone terminal tHP inserted therein, is fitted in the first sleeve 23a. The headphone terminal tHP is mounted on a terminal board 26 that is connected to the board 30 through the first sleeve 23a.

A helical spring 27 is disposed around the inner sleeve 24. The helical spring 27 normally urges the shuttle switch 8d to return to the neutral position when it is released from external forces that rotate the shuttle switch 8d.

A pair of leaf springs 28 with balls is mounted in the shuttle switch 8d. When the shuttle switch 8d is placed around the first sleeve 23a, the balls of the leaf springs 28 are fitted in respective grooves in the first sleeve 23a, limiting the shuttle switch 8d against rotation and allowing the shuttle switch 8d to be positioned stepwise axially.

As described above, the flat surface on the upper portion of the casing 20 has a hole defined therein which faces the display 15 placed in the casing 20 and a hole defined therein which faces various switches of the switch assembly 33. When the display 15 and the switch assembly 33 are placed in the casing 20, the display 15 and the switches of the switch assembly 33 are held in alignment with the holes.

A water-resistant sheet 21a is attached to the flat surface on the upper portion of the casing 20. A switch cover 80, which serves as part of the DISP/MENU key 8b, the PLAY/STOP key 8c, the VOL+ key 8e, and the VOL− key 8f of the operation unit 8, and a casing cover 21 are mounted on the water-resistant sheet 21a. The switch cover 80 is integrally molded of a rubber-based material, for example, and has convex portions provided respectively as the DISP/MENU key 8b, the PLAY/STOP key 8c, the VOL+ key 8e, and the VOL− key 8f. The switch cover 80 is held in intimate contact with the water-resistant sheet 21a to prevent water from entering the casing 20 through the hole defined in the casing 20 in alignment with the switch assembly 33.

Electrodes 81 serving as posts are disposed in the respective convex portions of the switch cover 80. When the DISP/MENU key 8b, the PLAY/STOP key 8c, the VOL+ key 8e, and the VOL− key 8f provided as the convex portions of the switch cover 80 are depressed, the electrodes 81 operate the corresponding switches of the switch assembly 33 housed in the casing 20.

The casing cover 21 covers the hole defined in the casing 20 in alignment with the display 15, and is also used to hold the switch cover 80 in position. The casing cover 21 is held in intimate contact with the water-resistant sheet 21a to prevent water from entering the casing 20 through the hole defined in the casing 20 in alignment with the display 15.

The shuttle switch 8d is positionally detected by a position detecting means including a magnet 40 mounted on the inner surface of the shuttle switch 8d and a plurality of Hall devices 41 mounted on the terminal board 26.

Figure 8:
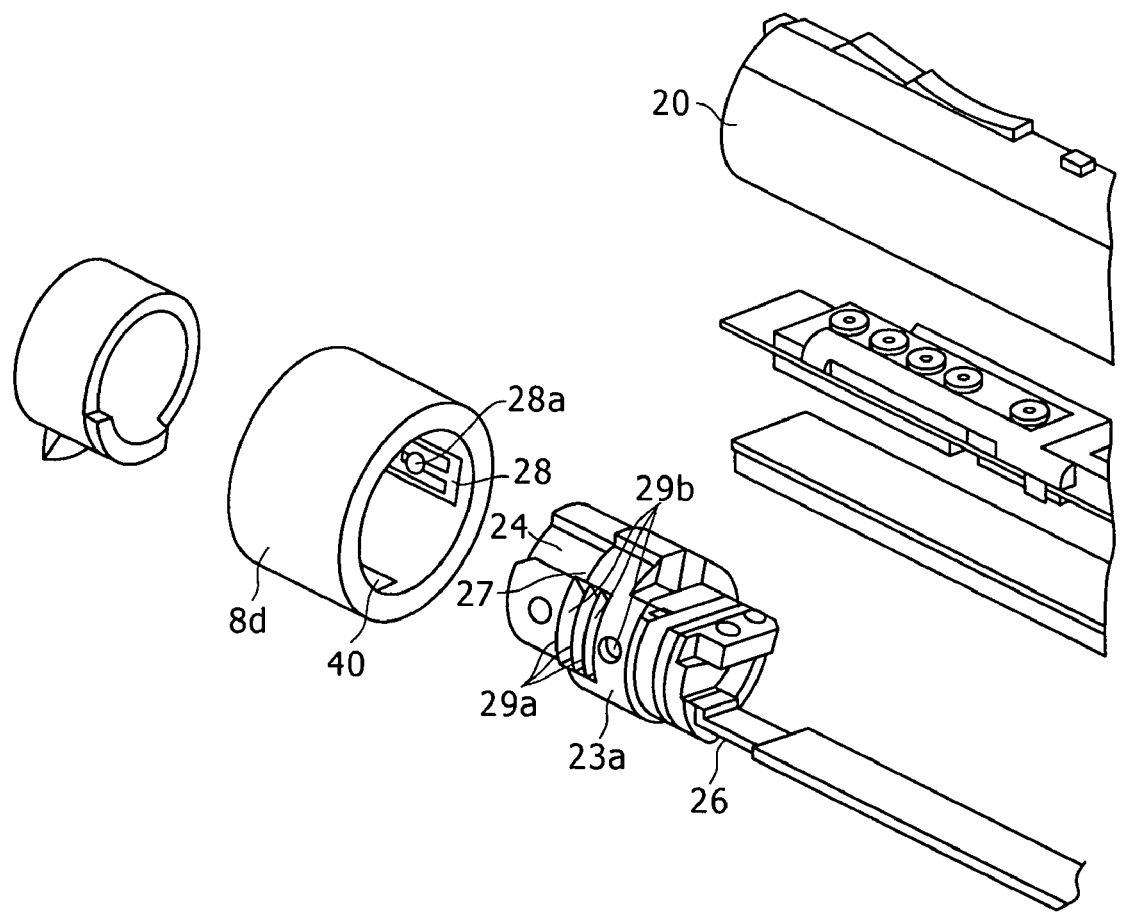
FIG. 8 is a perspective view showing a shuttle switch and related parts.
Figure 9:
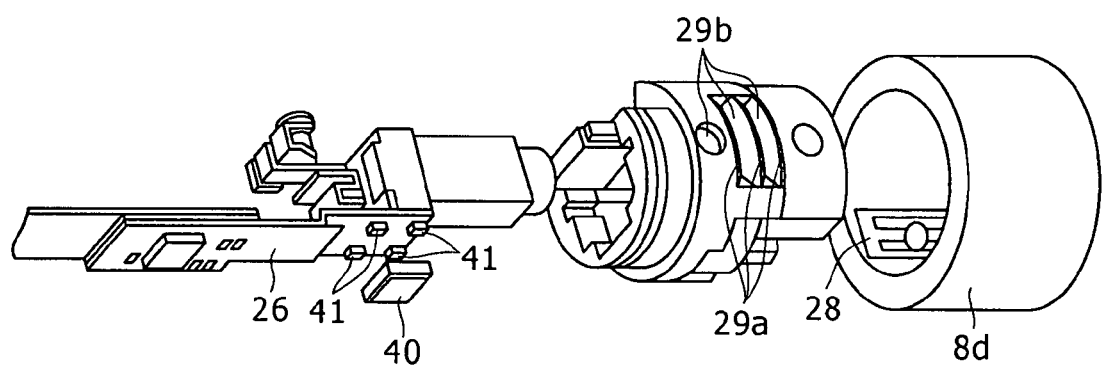
FIG. 9 is a perspective view showing the shuttle switch and related parts.

FIG. 8 shows in exploded perspective the shuttle switch 8d and related parts, and FIG. 9 also shows in exploded perspective the shuttle switch 8d and related parts. In FIGS. 8 and 9, the shuttle switch 8d and related parts are viewed from different angles.

The leaf springs 28 with balls 28a for positioning the shuttle switch 8d and the magnet 40 of the position detecting means are mounted on the inner surface of the shuttle switch 8d. The four Hall devices 41 are mounted on the lower surface of the terminal board 26 which supports the headphone terminal tHP that is inserted in the inner sleeve 24 in the first sleeve 23a.

When the first sleeve 23a, the inner sleeve 24, and the headphone terminal tHP supported on the terminal board 26 are assembled together and then placed in the casing 20 and thereafter the shuttle switch 8d is mounted on the casing 20, the magnet 40 mounted in the shuttle switch 8d and the four Hall devices 41 mounted on the terminal board 26 in the casing 20 are positioned in association with each other. The shuttle switch 8d is positionally detected based on a magnetic flux density that varies depending on the positional relationship between the magnet 40 and the Hall devices 41.

When the shuttle switch 8d is mounted on the casing 20, the balls 28a of the leaf springs 28 move over ridges 28a of the first sleeve 23a into grooves 29b in the first sleeve 23a. There are two diametrically opposite balls 28a disposed on the inner surface of the shuttle switch 8d, and the first sleeve 23a has two diametrically opposite sets of ridges 28a and grooves 29b on the outer surface thereof. Since the balls 28a are normally urged toward the first sleeve 23a under the resiliency of the leaf springs 28, when the balls 28a are placed in the grooves 29b, the balls 28a are positionally restricted by the ridges 29a, thereby limiting the direction and distance that the shuttle switch 8d moves with respect to the casing 20.

In the present embodiment, the first sleeve 23a has two elongate grooves 29b of a certain length extending along the outer circumferential surface thereof and a dimple-like groove 29b slightly greater than the balls 28a. The elongate grooves 29b and the dimple-like groove 29b are arrayed in the axial direction. The shuttle switch 8d slides to and is retained in either one of the three positions P1, P2, P3 depending on which of these three grooves 29b each of the balls 28a is placed in.

When the ball 28a is placed in one of the two elongate grooves 29b, the ball 28a can move circumferentially for a distance depending on the length of the groove 29b, allowing the shuttle switch 8d to rotate about its own axis. When the ball 28a is placed in the dimple-like groove 29b, the shuttle switch 8d is unable to rotate about its own axis. The two elongate grooves 29b that are selectively occupied by the ball 28a represent the positions P2, P3 of the shuttle switch 8d, and the dimple-like groove 29b that is occupied by the ball 28a represents the position P1 of the shuttle switch 8d.

Though the shuttle switch 8d is slidable selectively to the three positions P1, P2, P3 in the present embodiment, the number of positions to which the shuttle switch 8d is slidable is determined by the number of grooves 29b axially arrayed on the first sleeve 23a. The angular interval through which the shuttle switch 8d is rotatable about its own axis is determined by the circumferential length of the elongate grooves 29b. The resistance that the shuttle switch 8d undergoes when it is clicked into the positions P1, P2, P3 is determined by the height of the ridges 29a. Specifically, the higher the ridges 29a, the greater the resistance that the shuttle switch 8d undergoes when it is clicked into the positions P1, P2, P3.

When the inner sleeve 24 is placed in the first sleeve 23a, the helical spring 27 disposed around the inner sleeve 24 has its both ends projecting outwardly through slits in the first sleeve 23a. When the shuttle switch 8d is then placed on the first sleeve 23a, the projecting ends of the helical spring 27 engage respective protrusions on the inner surface of the shuttle switch 8d. Accordingly, the shuttle switch 8d is resiliently movable with respect to the first sleeve 23a. Specifically, when the shuttle switch 8d is held by fingers and rotated about its own axis, biasing forces from the helical spring 27 act on the shuttle switch 8d. When the shuttle switch 8d is released from the fingers, the shuttle switch 8d automatically returns to its neutral position under the bias of the helical spring 27. As the opposite ends of the helical spring 27 engage protrusions on the inner surface of the shuttle switch 8d, the shuttle switch 8d can automatically return to its neutral position irrespectively of the direction in which the shuttle switch 8d is rotated about its own axis.

Figure 10:
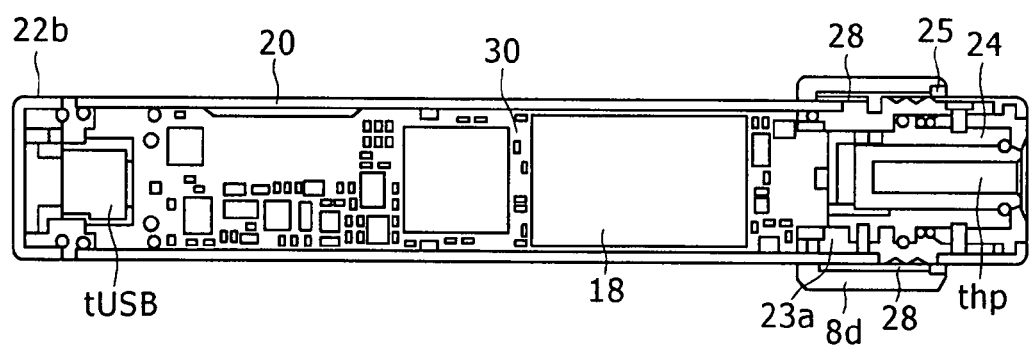
FIG. 10 is a sectional plan view of the contents playback apparatus.
Figure 11:
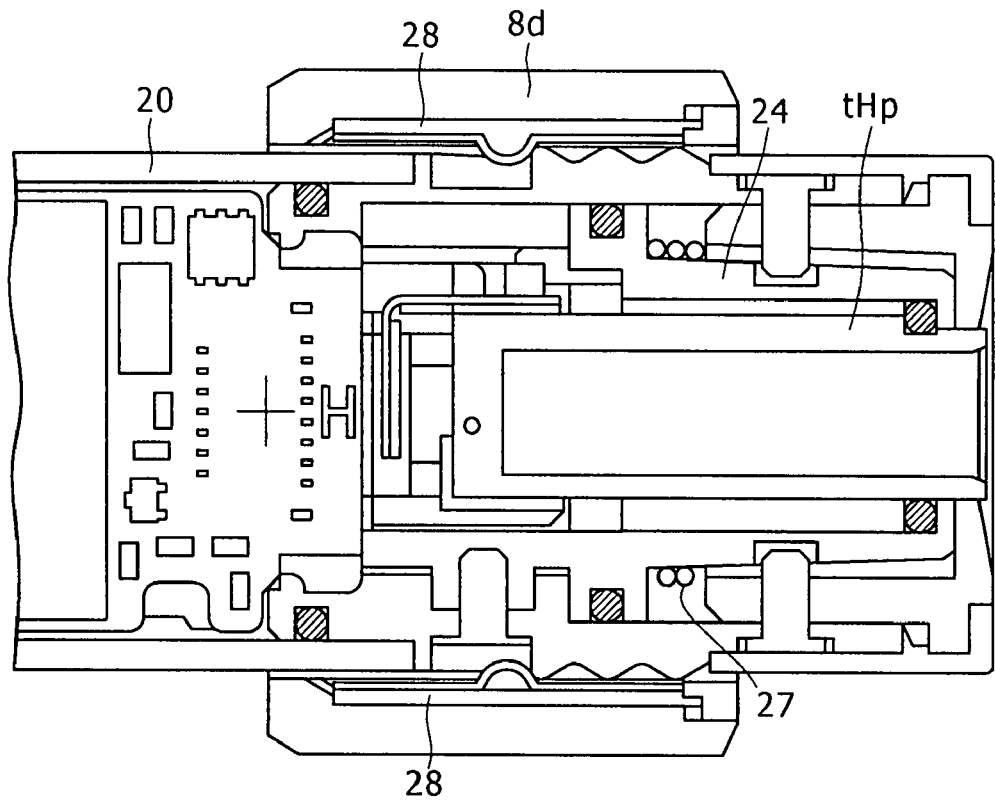
FIG. 11 is an enlarged sectional plan view of the shuttle switch and related parts.
Figure 12:
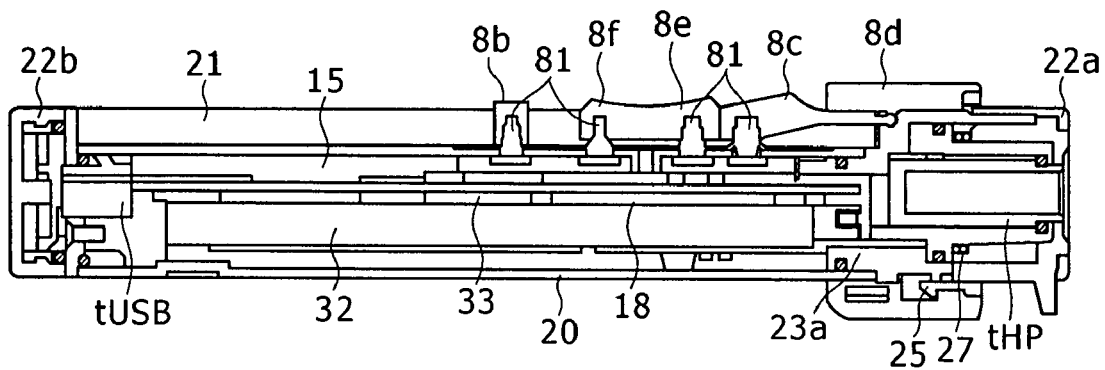
FIG. 12 is a sectional side elevational view of the contents playback apparatus.
Figure 13:
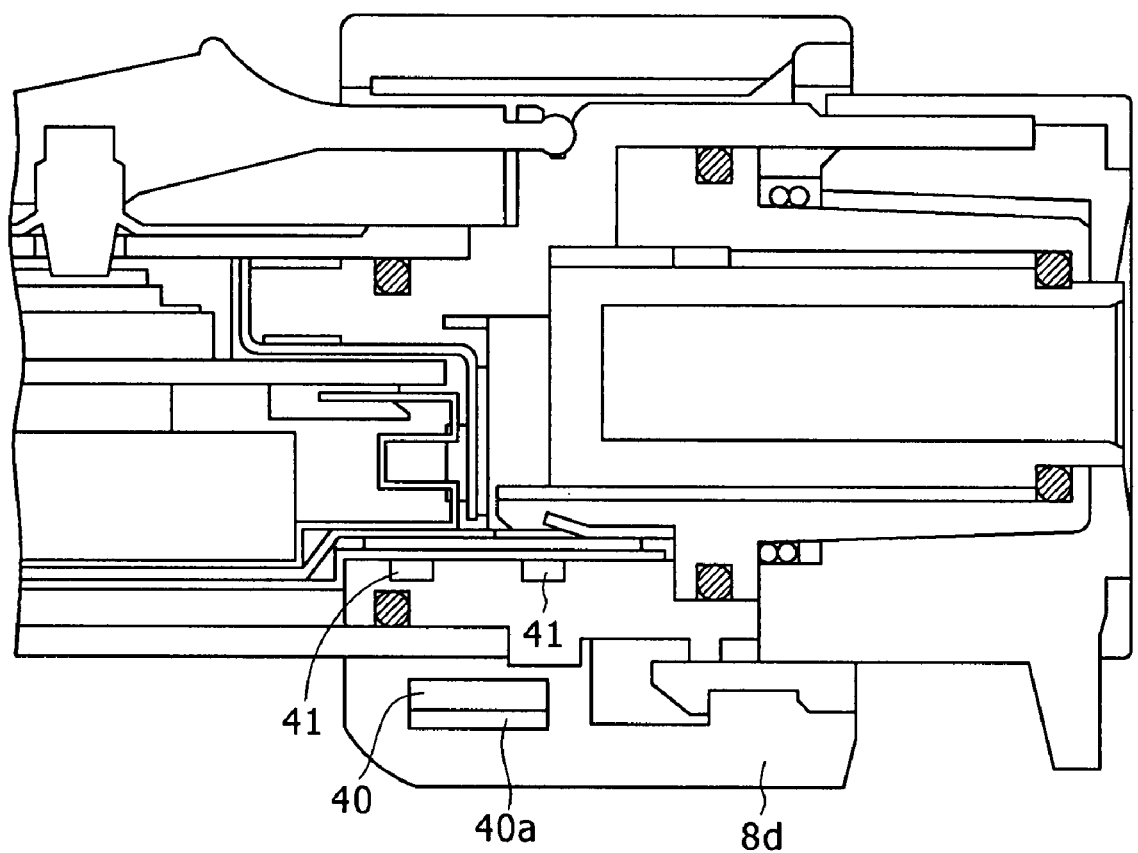
FIG. 13 is an enlarged sectional side elevational view of the shuttle switch and related parts.

FIG. 10 shows in sectional plan the contents playback apparatus 2, FIG. 11 shows in enlarged sectional plan the shuttle switch 8d and related parts, FIG. 12 shows in sectional side elevation the contents playback apparatus 2, and FIG. 13 shows in enlarged sectional side elevation the shuttle switch 8d and related parts.

After the board 30 and other parts are placed in the tubular casing 20, the end of the casing 20 in which the USB terminal tUSB is positioned is closed by the second sleeve 23b and the second cap 22b, and the end of the casing 20 in which the headphone terminal tHP is positioned is closed by the first sleeve 23a, the inner sleeve 24, and the first cap 22a. In this manner, the opposite ends of the casing 20 are made water-resistant in structure.

Specifically, hatched circles shown in FIGS. 10 through 13 represent water-resistant O-rings. In the present embodiment, the tubular casing 20 can easily and reliably be made water-resistant by the O-rings.

For example, in the end of the casing 20 in which the headphone terminal tHP is positioned, O-rings are disposed respectively at the junction between the casing 20 and the first sleeve 23a, the junction between the first sleeve 23a and the inner sleeve 24, and the junction between the inner sleeve 24 and the headphone terminal tHP. In the end of the casing 20 in which the USB terminal tUSB is positioned, O-rings are disposed respectively at the junction between the casing 20 and the second sleeve 23b and the junction between the second sleeve 23b and the second cap 22b.

The display 15 in the casing 20 is made water-resistance because the hole for the display 15 is covered with the water-resistant sheet, the switch cover 80, and the casing cover 21. Since the shuttle switch 8d is detected for movement in a contactless manner, there is no hole in the portion of the casing 20 which is surrounded by the shuttle switch 8d. As a result, the contents playback apparatus 2 is sufficiently water-resistant.

Furthermore, as no link mechanism is present between the shuttle switch 8d and the casing 20, the space in the shuttle switch 8d around the casing 20 can effectively be utilized. Specifically, as no link mechanism takes up a space in the shuttle switch 8d, the headphone terminal tHP and other circuits may be placed within the shuttle switch 8d. The contents playback apparatus 2 can thus be highly packed and small in size.

According to the present embodiment, the contents playback apparatus 2 is cylindrical in overall shape, highly simple in arrangement, and excellent in water resistance. The cylindrical contents playback apparatus 2 may be combined with a holder such as an arm band, a grip, or the like.

As shown in FIG. 13, a yoke plate 40a may be mounted on the surface of the magnet 40 remotely from the casing 20. The yoke plate 40a is made of a magnetic material to reduce magnetic fluxes directed from the magnet 40 toward the yoke plate 40a and to direct magnetic fluxes at a high density toward the Hall devices 41. In this manner, the Hall devices 41 can detect magnetic fluxes highly reliably. In addition, any flux leakage from the magnet 40 outside of the contents playback apparatus 2 is reduced to minimize adverse effects on other apparatus. The adverse effects of magnetic fields that are applied from an external source to the contents playback apparatus 2 are also reduced to stabilize the operation of the contents playback apparatus 2.

Figure 14A:
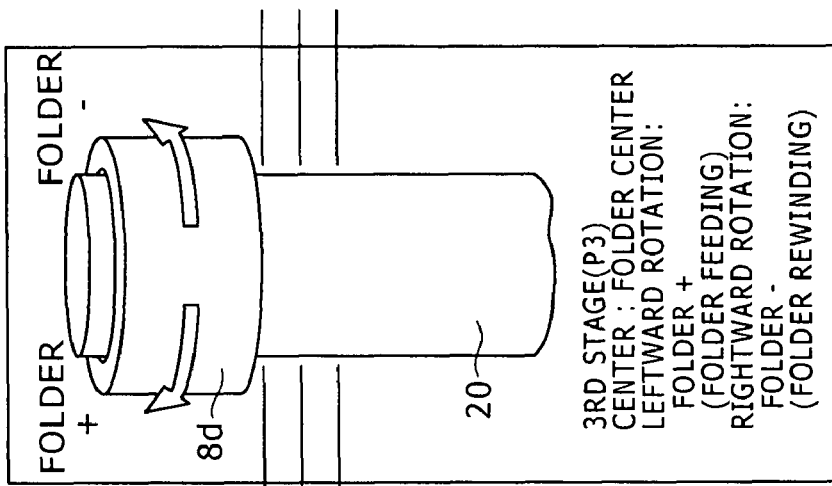
FIG. 14 is a view showing an association between movements of the shuttle switch and representative contents playback functions.

Contents playback functions performed by moving the shuttle switch 8d will be described below. FIG. 14 shows an association between movements of the shuttle switch 8d and representative contents playback functions. As shown in FIG. 14A, when the shuttle switch 8d is in the first state (the position P1), the shuttle switch 8d cannot be rotated, but is fixed in the central position (neutral position), placing the contents playback apparatus 2 in the HOLD mode. In the HOLD mode, the presently selected function cannot change to any other functions, protecting the contents playback apparatus 2 against operation in error.

Figure 14B:
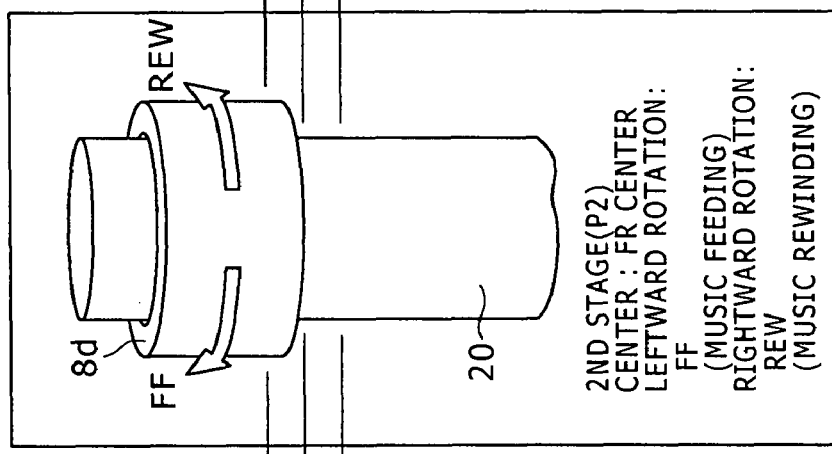
Figure 14C:
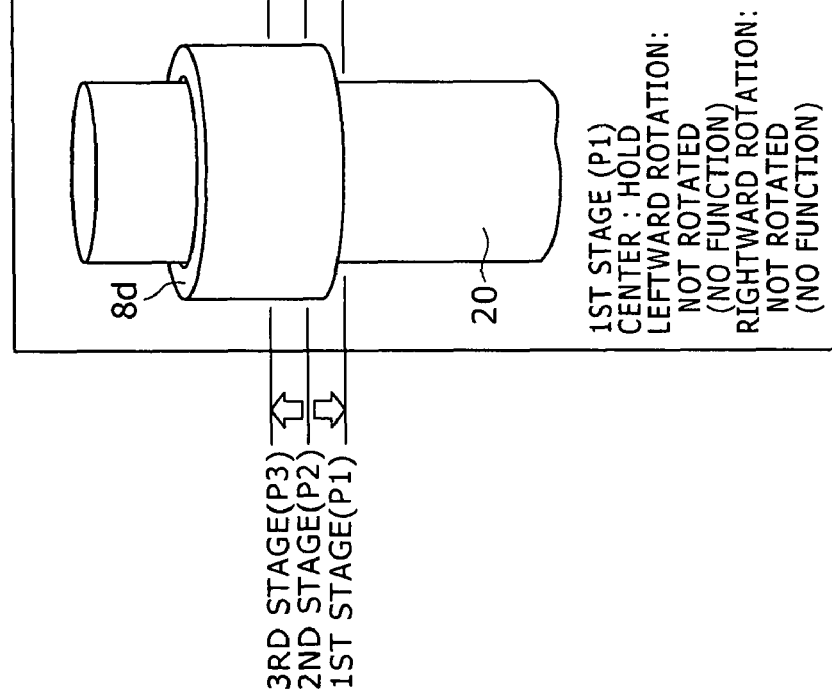

As shown in FIG. 14B, when the shuttle switch 8d is in the second state (the position P2), the shuttle switch 8d is made rotatable. If the shuttle switch 8d is rotated leftward from the central position, then the contents playback apparatus 2 operates in the FF mode (tracks are fast-fed during playback, or tracks are incrementally skipped and accessed during stop). If the shuttle switch 8d is released after being rotated, it returns to the central position. Specifically, if the shuttle switch 8d is rotated once leftward, one track is fed, and if the shuttle switch 8d is rotated twice leftward, two tracks are fed, and if the shuttle switch 8d is rotated three times leftward, three tracks are fed, and so on. Therefore, as many tracks can be fed as the number of times that the shuttle switch 8d is rotated leftward. If the shuttle switch 8d is continuously rotated leftward, then the track that is being currently played back can be fed forwardly during playback, and tracks are continuously incrementally skipped during stop.

Conversely, if the shuttle switch 8d is rotated rightward from the central position, then the contents playback apparatus 2 operates in the FR mode (tracks are reversely fed during playback, or tracks are decrementally skipped and accessed during stop). If the shuttle switch 8d is released after being rotated, it returns to the central position. Specifically, if the shuttle switch 8d is rotated once rightward, one track is reversed, and if the shuttle switch 8d is rotated twice rightward, two tracks are reversed, and if the shuttle switch 8d is rotated three times rightward, three tracks are reversed, and so on. Therefore, as many tracks can be reversed as the number of times that the shuttle switch 8d is rotated rightward. If the shuttle switch 8d is continuously rotated rightward, then the track that is being currently played back can be reversed during playback, and tracks are continuously decrementally skipped during stop.

When the shuttle switch 8d is in the third state (the position P3), the shuttle switch 8d is made rotatable. If the shuttle switch 8d is rotated leftward from the central position, then Folders (albums, play lists, etc.) are fed. If the shuttle switch 8d is released after being rotated, it returns to the central position. Specifically, if the shuttle switch 8d is rotated once leftward, one Folder is fed, and if the shuttle switch 8d is rotated twice leftward, two Folders are fed, and if the shuttle switch 8d is rotated three times leftward, three Folders are fed, and so on. Therefore, as many Folders can be fed as the number of times that the shuttle switch 8d is rotated leftward. If the shuttle switch 8d is continuously rotated leftward, then Folders are continuously fed.

Conversely, if the shuttle switch 8d is rotated rightward from the central position, then Folders are reversed. If the shuttle switch 8d is released after being rotated, it returns to the central position. Specifically, if the shuttle switch 8d is rotated once rightward, one Folder is reversed, and if the shuttle switch 8d is rotated twice rightward, two Folders are reversed, and if the shuttle switch 8d is rotated three times rightward, three Folders are reversed, and so on. Therefore, as many Folders can be reversed as the number of times that the shuttle switch 8d is rotated rightward. If the shuttle switch 8d is continuously rotated rightward, then Folders are continuously reversed.

The above assignment of the movements and rotations of the shuttle switch 8d to the functions is given by way of example only, and the movements and rotations of the shuttle switch 8d may be differently assigned to the functions. The assignment of the movements and rotations of the shuttle switch 8d to the functions may be changed by the user. If a certain number of patterns of the assignment of the movements and rotations of the shuttle switch 8d to the functions are available for the user to choose from, then the user finds the contents playback apparatus 2 easy and convenient to use.

Figure 15:
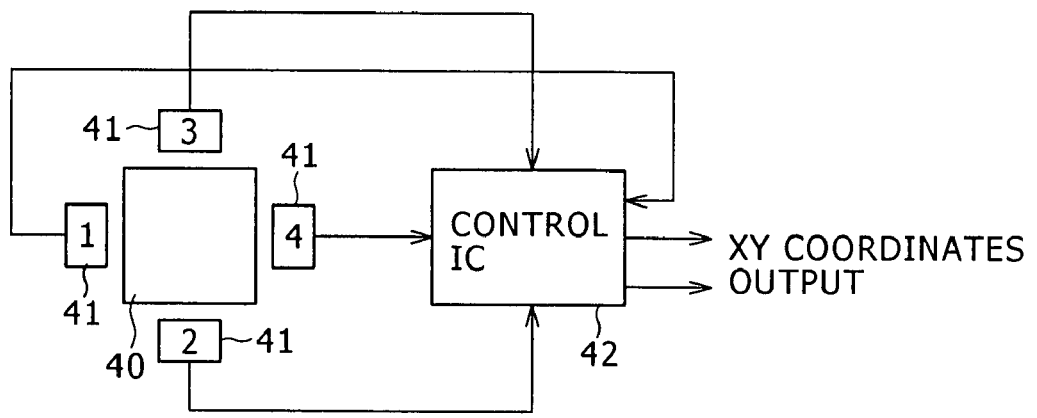
FIG. 15 a block diagram showing the principles of positional detection using a magnet and a plurality of Hall devices.

The selection of the functions based on the position of the shuttle switch 8d is carried out in a contactless manner based on the positional relationship between the magnet 40 and the Hall devices 41 as described above. FIG. 15 shows in block form the principles of positional detection using the magnet 40 and the Hall devices 41. As shown in FIG. 15, two Hall devices 41 which are spaced in an X-axis direction and two Hall devices 41 which are spaced in a Y-axis direction are fixedly positioned with respect to the magnet 40 which is movable. The X-axis direction refers to the direction in which the shuttle switch 8d is rotatable, and the Y-axis direction refers to the direction in which the shuttle switch 8d is slidable.

When the magnet 40 is positionally changed with respect to the four fixed Hall devices 41, the magnetic fluxes generated by the magnet 40 are detected individually by the four Hall devices 41. A control IC 42 varies outputs from the four Hall devices 41 and outputs X and Y coordinates representing the position of the magnet 40.

For example, if the magnetic fluxes detected by the four Hall devices 41 are denoted by H1 through H4 as shown in FIG. 15, then the X coordinate of the position of the magnet 40 is calculated as H4−H1 and the Y coordinate of the position of the magnet 40 is calculated as H3−H2. With the Hall devices 41 being mounted on the casing 20 and the magnet 40 on the shuttle switch 8d, therefore, the relative position of the shuttle switch 8d with respect to the casing 20 can be detected.

The control IC 42 which calculates and outputs the position of the shuttle switch 8d in response to the signals output from the four Hall devices 41 may be an independent IC or may be implemented by the controller 6 shown in FIG. 3.

Figure 16A:
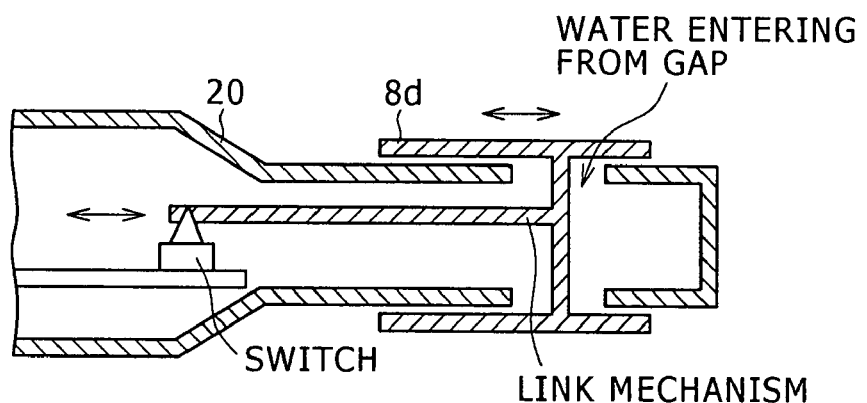
FIGS. 16A and 16B are cross-sectional views illustrative of the difference between the structure of a shuttle switch of the related art and the structure of the shuttle switch according to the embodiment of the present invention.
Figure 16B:
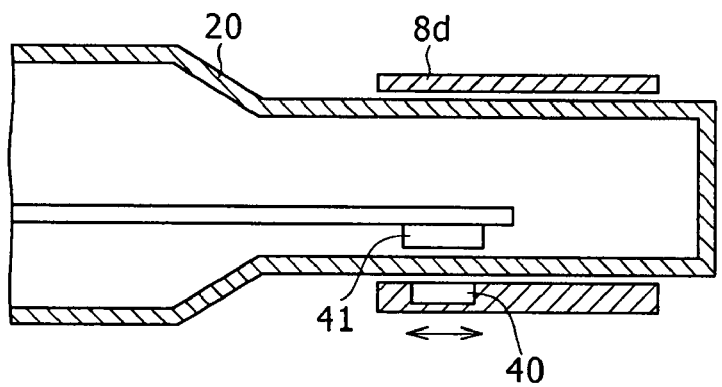

FIGS. 16A and 16B are illustrative of the difference between the structure of a shuttle switch 8d of the related art and the structure of the shuttle switch 8d according to the present embodiment. The shuttle switch 8d of the related art shown in FIG. 16A includes a link mechanism for mechanically operating a switch in the casing 20, the link mechanism extending through a hole defined in the casing 20 to the switch in the casing 20. It is necessary to connect the link mechanism to the shuttle switch 8d and extend the link mechanism accurately to the switch in the casing 20. In addition, since the hole defined in the casing 20 allows water to enter the casing 20, the contents playback apparatus of the related art is not highly water-resistant.

The shuttle switch 8d according to the present embodiment shown in FIG. 16B can be positionally detected in a contactless manner by the magnet 40 and the Hall devices 41. Therefore, the casing 20 does not need to have a hole for the position detecting means. Since the Hall devices 21 are disposed in the closed casing 20 and the magnet 40 is disposed in the shuttle switch 8d around the casing 20, the position of the shuttle switch 8d can be detected while the contents playback apparatus 2 is kept water-resistant.

As the position of the shuttle switch 8d is detected based on the relative positional relationship between the magnet 40 and the Hall devices 41, even if there is a positional deviation between the magnet 40 and the Hall devices 41 which is produced when the shuttle switch 8d is mounted on the casing 20, a deviation of the detected position due to the positional deviation can be canceled out by calibrating detected values from the Hall devices 41.

FIGS. 17A and 17B shows the layouts of four Hall devices. According to the present embodiment, the four Hall devices 41 may be placed in a layout where two of the Hall devices 41 are arrayed along the X-axis and the other two along the Y-axis (lozenge-shaped layout), as shown in FIG. 17A, and may be placed in a layout where the Hall devices 41 are displaced off the X-axis and the Y-axis (square-shaped layout).

If the four Hall devices 41 are placed in the lozenge-shaped layout, then since the two axes provided by the four Hall devices 41 agree with the two axes along which the shuttle switch 8d is movable, the above formulas for calculating the X coordinate of the position of the magnet 40 as H4−H1 and the Y coordinate of the position of the magnet 40 as H3−H2 are directly applicable. If the four Hall devices 41 are placed in the square-shaped layout, however, then since the two axes provided by the four Hall devices 41 are angularly shifted 45° from the two axes along which the shuttle switch 8d is movable, a different algorithm needs to be used for detecting the position of the magnet 40.

Figure 18A:
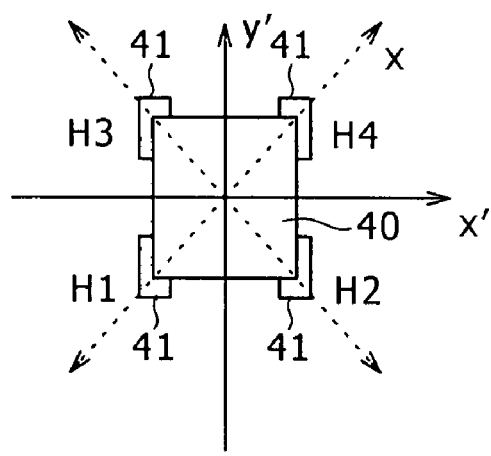
FIGS. 18A through 18C are views showing the positional relationship between the square-shaped layout of the Hall devices and the magnet.
Figure 18B:
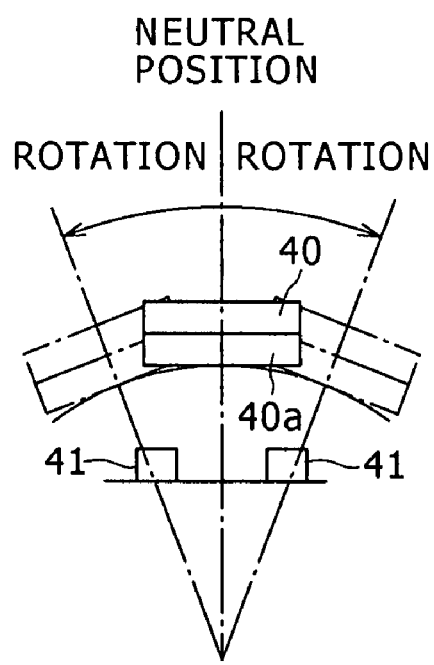
Figure 18C:
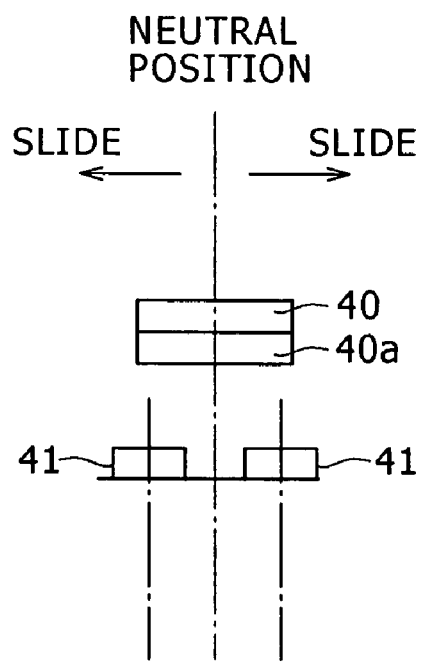

FIG. 18A through 18C show the positional relationship between the square-shaped layout of the Hall devices 41 and the magnet 40. FIG. 18A shows the Hall devices 41 and the magnet 40 in plan, FIG. 18B shows the Hall devices 41 and the magnet 40 in front elevation as viewed along the central axis of the casing 20, and FIG. 18C shows the Hall devices 41 and the magnet 40 in side elevation. The magnet 40 is movable along the axes along which the shuttle switch 8d is movable, and these axes are referred to as an X'-axis and a Y'-axis, respectively. The axes interconnecting confronting two of the Hall devices 41 in the respective pairs are referred to as an X-axis and a Y-axis, respectively. If the magnetic fluxes detected by the four Hall devices 41 are denoted by H1 through H4 as shown in FIG. 18A, then the X coordinate of the position of the magnet 40 is calculated as H4−H1 and the Y coordinate of the position of the magnet 40 is calculated as H3−H2.

Since the X-, Y-axes are angularly shifted 45° from the X'-, Y'-axes, the X' coordinate of the position of the magnet 40 is calculated as $X'=1/\sqrt{2}(-H1+H2-H3+H4)$ and the Y, coordinate of the position of the magnet 40 is calculated as $Y'=1/\sqrt{2}(-H1-H2+H3+H4)$ based on the transformation formulas $X'=1/\sqrt{2}\times(X-Y)$, $Y'=1/\sqrt{2}\times(X+Y)$ for 45° vector rotation. According to the above formulas, the coordinates along the axes of the shuttle switch 8d can be obtained from the detected values from the four Hall devices 41 that are placed in the square-shaped layout.

Figure 19:
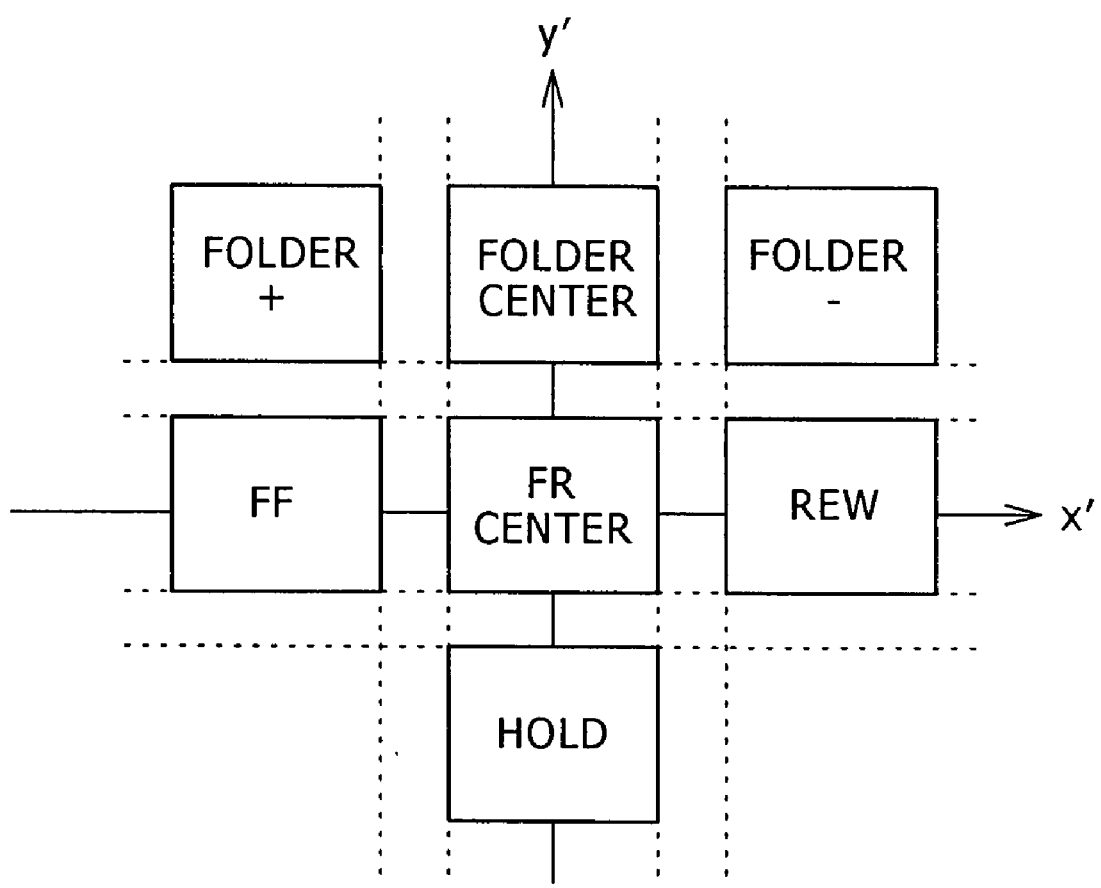
FIG. 19 is a diagram showing an example of functions assigned to sets of coordinates reached when the shuttle switch moves.

FIG. 19 shows an example of functions assigned to sets of coordinates reached when the shuttle switch 8d moves. The coordinates reached when the shuttle switch 8d moves are denoted as X', Y' and are classified into respective zones arranged in a matrix. Functions are assigned when the shuttle switch 8d is moved into the respective zones. The X', Y' coordinates of the position of the magnet 40 as calculated above are determined as falling in one of the zones based on thresholds. When the X', Y' coordinates exceed the thresholds, the function assigned to the zone is performed.

The thresholds are determined as follows: After the casing 20 and the shuttle switch 8d are fully assembled together, the shuttle switch 8d is moved to some of the zones and its X', Y' coordinates are read. The thresholds which are peculiar to the contents playback apparatus 2 that is actually used are determined based on the X', Y' coordinate readings. In this manner, errors due to variations of the magnetic forces of the magnet 40 and variations of the position thereof at the time the shuttle switch 8d is assembled on the casing 20 are canceled out.

When the position of the shuttle switch 8d is detected based on the positional relationship between the four Hall devices and the magnet, it is desirable that the difference between the detecting sensitivity in the X-axis direction on a given Y coordinate and the detecting sensitivity in the X-axis direction on another Y coordinate be small. From this standpoint, the four Hall devices 41 is more advantageously placed in the lozenge-shaped layout than in the square-shaped layout.

Figure 20:
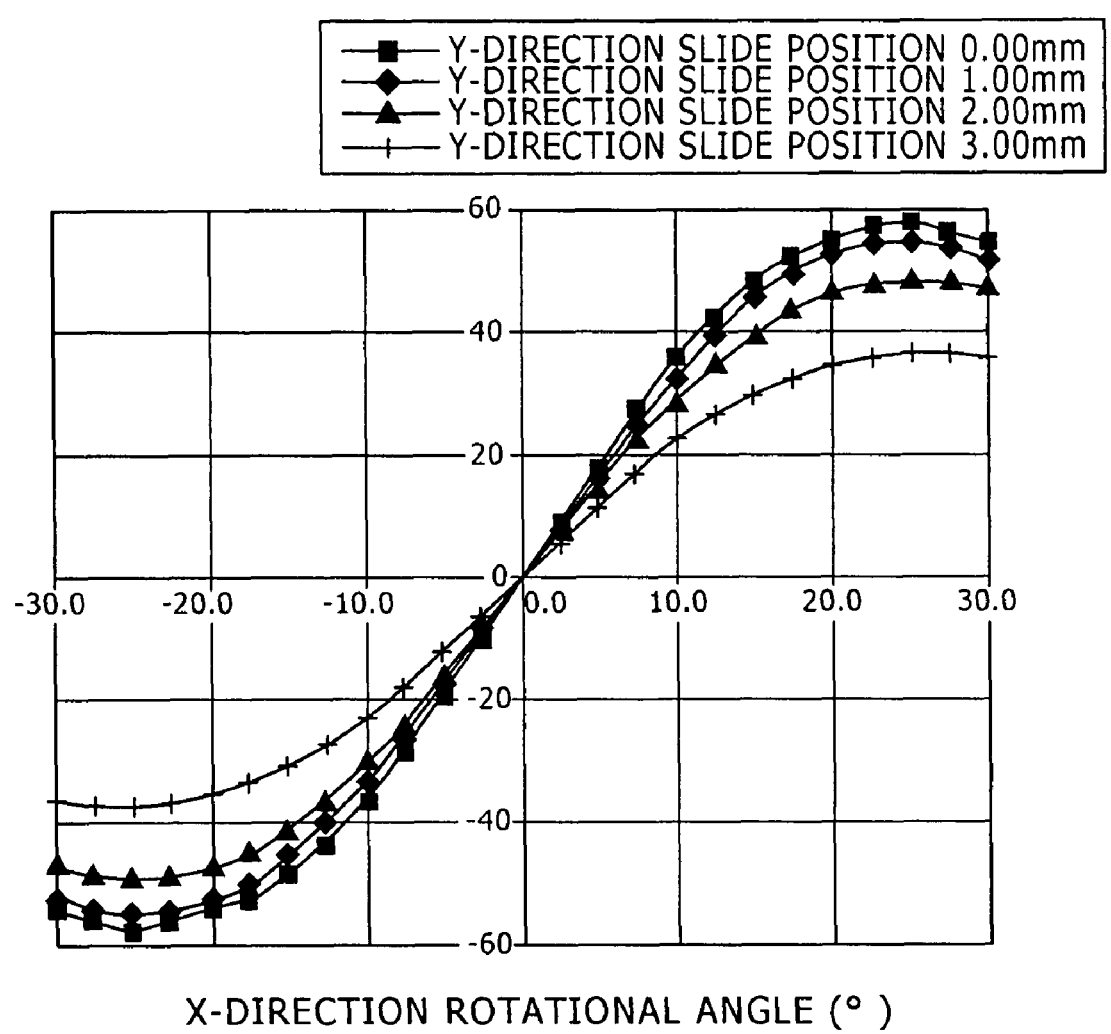
FIG. 20 is a diagram showing different output values produced when the Hall devices are placed in a square-shaped layout.
Figure 21:
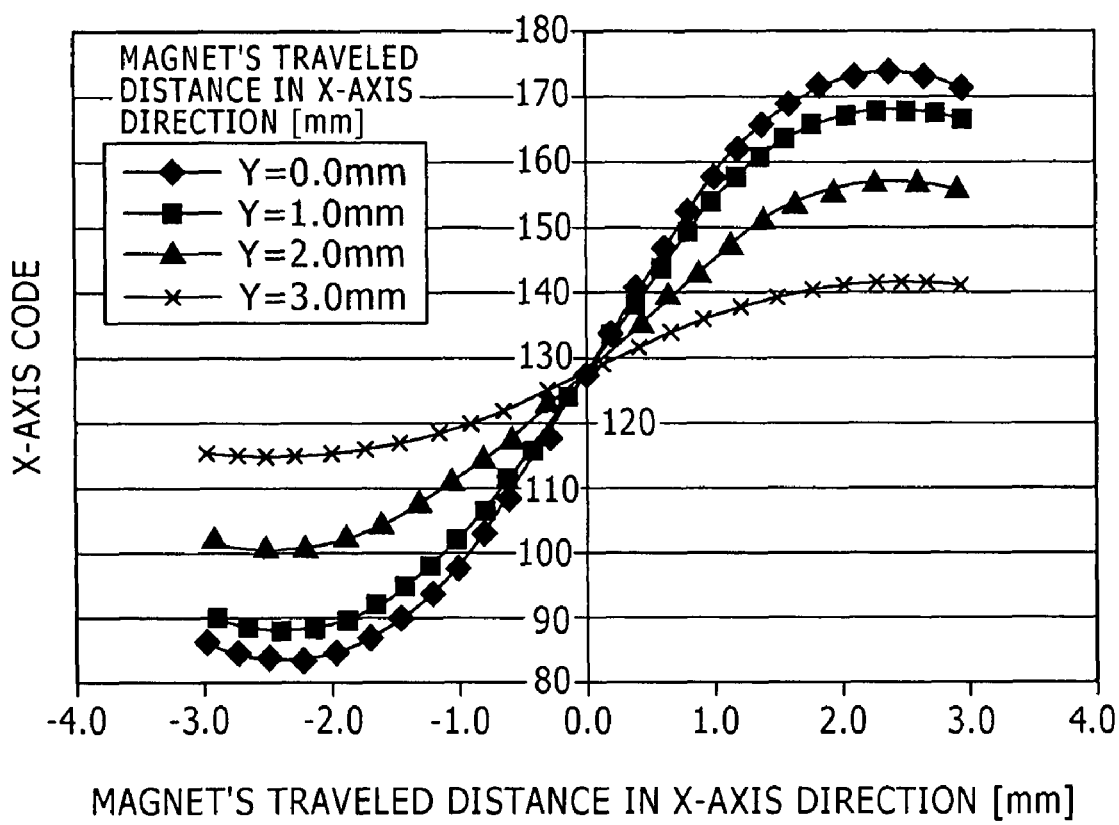
FIG. 21 is a diagram showing different output values produced when the Hall devices are placed in a lozenge-shaped layout.

FIG. 20 shows different output values produced by the Hall devices which are placed in the square-shaped layout, and FIG. 21 shows different output values produced by the Hall devices which are placed in the lozenge-shaped layout. In FIGS. 20 and 21, the horizontal axis represents the position of the magnet in the X-axis direction, the vertical axis represents the output value of the Hall devices, and the parameters represent the position to which the magnet slides in the Y-axis direction.

According to the square-shaped layout as shown in FIG. 20, the detecting sensitivity when the position to which the magnet slides in the Y-axis direction is represented by 2 mm is about 87% of the detecting sensitivity when the position to which the magnet slides in the Y-axis direction is represented by 0 mm. According to the lozenge-shaped layout as shown in FIG. 21, the detecting sensitivity when the position to which the magnet slides in the Y-axis direction is represented by 2 mm is about 60% of the detecting sensitivity when the position to which the magnet slides in the Y-axis direction is represented by 0 mm. Therefore, the detecting sensitivity change depending on the position to which the magnet slides in the Y-axis direction is smaller for the square-shaped layout than for the lozenge-shaped layout. Consequently, the four Hall devices placed in the square-shaped layout are capable of detecting the position of the shuttle switch more accurately than the four Hall devices placed in the lozenge-shaped layout.

The principles of the present invention are also applicable to electronic devices, e.g., a headphone remote controller and various device controllers, which employ an operation element (shuttle switch) for controlling a certain electronic circuit, rather than the contents playback apparatus according to the illustrated embodiment.

In the above embodiment, the single shuttle switch 8d is disposed around the casing 20. However, a plurality of shuttle switches may be disposed around the casing 20 for giving the user a wider range of functions that can be selected.

Although a certain preferred embodiment of the present invention has been shown and described in detail, it should be understood that various changes and modifications may be made therein without departing from the scope of the appended claims.

What is claimed is:

1. A contents playback apparatus comprising:
   a tubular casing;
   a contents playback unit disposed in said casing;
   an operation element rotatably disposed around said casing and axially movably disposed on said casing;
   a magnet disposed on said operation element;
   a plurality of Hall devices disposed in said casing for detecting a density of magnetic fluxes from said magnet in a contactless fashion; and
   a controller for determining a position of said operation element based on the density of magnetic fluxes detected by said plurality of Hall devices upon movement of said operation element, and controlling said contents playback unit to play back contents depending on the determined position of said operation element.

2. The contents playback apparatus according to claim 1, wherein said plurality of Hall devices comprise four Hall devices disposed in respective positions displaced off an axis along which said operation element is rotatable around said casing and an axis along which said operation element is movable axially along said casing.

3. The contents playback apparatus according to claim 1, further comprising:
   a yoke member mounted on a side of said magnet remote from said casing.

4. The contents playback apparatus according to claim 1, wherein said casing has a hole defined therein, the contents playback apparatus further comprising:
   a cover covering said hole; and
   a water blocking member disposed between said hole and said cover.

5. The contents playback apparatus according to claim 1, wherein said controller determines a matrix of positions to which said operation elements is rotated around said casing and is moved axially along said casing.

6. The contents playback apparatus according to claim 1, wherein said controller determines the position of said operation element by comparing detected values output from said plurality of Hall devices and predetermined thresholds.

7. The contents playback apparatus according to claim 1, wherein said operation element has a return position, said operation element being normally urged to return to said return position when external forces tending to move said operation element are not applied to said operation element.

8. A control method of detecting the position of an operation element rotatably disposed around a tubular casing and axially movably disposed on said tubular casing, and controlling a contents playback unit disposed in said casing to play back contents depending on the detected position of said operation element, the control method comprising the steps of:
- detecting a density of magnetic fluxes from a magnet disposed in said casing with a plurality of Hall devices disposed in said casing upon movement of said operation element;
- determining the position of said operation element based on the detected density of magnetic fluxes; and
- controlling said contents playback unit to play back contents depending on the determined position of said operation element.

9. The control method according to claim 8, wherein said step of controlling said contents playback unit comprises the steps of:
- determining the position of said operation element by comparing detected values output from said plurality of Hall devices and predetermined thresholds; and
- controlling said contents playback unit to play back contents depending on the determined position of said operation element.

10. An electronic device comprising:
a tubular casing;
an electronic circuit disposed in said casing;
an operation element rotatably disposed around said casing and axially movably disposed on said casing;
a magnet disposed on said operation element;
a plurality of Hall devices disposed in said casing for detecting a density of magnetic fluxes from said magnet in a contactless fashion; and
a controller for determining a position of said operation element based on the density of magnetic fluxes detected by said plurality of Hall devices upon movement of said operation element, and controlling said electronic circuit depending on the determined position of said operation element.

* * * * *